(12) United States Patent
Cherenkov et al.

(10) Patent No.: US 12,224,767 B2
(45) Date of Patent: Feb. 11, 2025

(54) SIGNAL PROCESSING APPARATUS FOR USE IN OPTICAL COMMUNICATION

(71) Applicant: HUAWEI TECHNOLOGIES CO., LTD., Shenzhen (CN)

(72) Inventors: Artem Vitalyevich Cherenkov, Moscow (RU); Man Zhao, Chengdu (CN); Mikhail Alexandrovich Linnik, Moscow (RU); Yijie Wang, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 130 days.

(21) Appl. No.: 18/167,380

(22) Filed: Feb. 10, 2023

(65) Prior Publication Data

US 2023/0188155 A1    Jun. 15, 2023

Related U.S. Application Data

(63) Continuation of application No. PCT/RU2020/000432, filed on Aug. 13, 2020.

(51) Int. Cl.
*H03M 1/66*   (2006.01)
*H03M 1/06*   (2006.01)
*H03M 1/08*   (2006.01)

(52) U.S. Cl.
CPC ......... *H03M 1/662* (2013.01); *H03M 1/0624* (2013.01); *H03M 1/0854* (2013.01)

(58) Field of Classification Search
CPC ............ H03M 1/06; H03M 1/08; H03M 1/66; H03M 1/662; H03M 1/0624; H03M 1/0854; H03M 1/1028
See application file for complete search history.

(56) References Cited

U.S. PATENT DOCUMENTS

| | | | |
|---|---|---|---|
| 8,502,715 B2 * | 8/2013 | Chen ................... | H03M 1/1023 341/120 |
| 9,276,602 B1 * | 3/2016 | Pagnanelli .......... | H03M 1/1038 |
| 9,685,969 B1 * | 6/2017 | Garg ...................... | H03M 1/66 |
| 9,831,886 B2 * | 11/2017 | El-Chammas ...... | H03M 1/1009 |
| 9,853,654 B2 * | 12/2017 | Naderi Alizadeh ... | H03M 3/368 |

(Continued)

*Primary Examiner* — Lam T Mai

(74) *Attorney, Agent, or Firm* — Maier & Maier, PLLC

(57) ABSTRACT

A signal processing apparatus includes a plurality of time-interleaving digital-to-analog converters each configured to sample a digital input signal at a preset sub-DAC sample frequency, and to generate an analog sub-DAC output signal. The signal processing apparatus includes analog multiplexer that samples the plurality of sub-DAC output signals at a preset multiplexer clock frequency and generates a multiplexer output signal. The signal processing apparatus further includes a local ADC that receives the multiplexer output signal and generate a digital feedback signal. The signal processing apparatus further includes a digital compensation engine that receives the digital feedback signal from the local ADC and determine one or more distortion compensation parameters. The signal processing apparatus further includes a digital pre-processing stage that receives the one or more distortion compensation parameters from the digital compensation engine and performs distortion compensation pre-processing on the digital input signal.

12 Claims, 14 Drawing Sheets

(56) References Cited

U.S. PATENT DOCUMENTS

| | | | |
|---|---|---|---|
| 9,900,016 B1* | 2/2018 | Trampitsch | H03M 1/66 |
| 9,966,969 B1* | 5/2018 | Engel | H03M 1/662 |
| 10,516,406 B1* | 12/2019 | Kuttner | H03M 1/0845 |
| 10,541,699 B1* | 1/2020 | Rutten | H03M 1/1061 |
| 10,693,483 B1* | 6/2020 | Luo | H03M 1/0836 |
| 10,911,029 B1* | 2/2021 | Velazquez | H03M 1/0626 |
| 10,965,302 B1* | 3/2021 | Zhao | H03M 7/165 |
| 11,057,042 B2* | 7/2021 | Yang | H03M 1/687 |
| 11,196,436 B1* | 12/2021 | Stepanovic | H03M 1/1061 |
| 11,356,111 B1* | 6/2022 | Xing | H03M 1/785 |
| 11,742,869 B2* | 8/2023 | Zortea | H03M 1/662 |
| | | | 341/144 |
| 11,990,911 B2* | 5/2024 | Rashidi | G06F 1/08 |
| 2011/0037631 A1* | 2/2011 | Lai | H03M 1/1004 |
| | | | 341/120 |
| 2015/0077169 A2* | 3/2015 | Carlson | H03M 1/08 |
| | | | 327/361 |
| 2016/0134302 A1* | 5/2016 | Schafferer | H03M 3/458 |
| | | | 341/120 |
| 2016/0182076 A1* | 6/2016 | El-Chammas | H03M 1/1009 |
| | | | 341/121 |
| 2017/0077945 A1* | 3/2017 | Pagnanelli | H03F 3/45475 |
| 2017/0237419 A1* | 8/2017 | Clara | H03K 5/13 |
| | | | 327/231 |
| 2019/0165820 A1* | 5/2019 | Xu | H03M 3/502 |
| 2019/0341923 A1* | 11/2019 | Conzatti | H03M 3/464 |
| 2020/0162091 A1* | 5/2020 | Huang | H03M 1/0607 |
| 2021/0075434 A1* | 3/2021 | Bhatta | H03M 1/0626 |
| 2022/0094369 A1* | 3/2022 | Stepanovic | H03M 3/358 |
| 2023/0198536 A1* | 6/2023 | Molina | H03M 1/1255 |
| | | | 341/120 |
| 2023/0238974 A1* | 7/2023 | Rutten | H03M 1/0621 |
| | | | 341/118 |
| 2024/0022270 A1* | 1/2024 | Asami | G06F 1/022 |
| 2024/0063809 A1* | 2/2024 | Mulder | H03M 1/1042 |
| 2024/0080033 A1* | 3/2024 | Patil | H03M 1/1047 |
| 2024/0080053 A1* | 3/2024 | Velazquez | H04B 1/40 |
| 2024/0291498 A1* | 8/2024 | Hartin | H03M 1/1215 |

* cited by examiner

SIGNAL PROCESSING APPARATUS FOR USE IN OPTICAL COMMUNICATION

CROSS-REFERENCE TO RELATED APPLICATIONS

This application is a continuation of International Patent Application No. PCT/RU2020/000432, filed on Aug. 13, 2020. The disclosure of the aforementioned application is hereby incorporated by reference in its entirety.

TECHNICAL FIELD

The embodiments relate generally to the field of optical communication and a signal processing apparatus for use in an ultra-wideband optical communication system or in a next generation optical communication system.

BACKGROUND

In order to fulfill the increasing data communication demands, there is a requirement to improve the capacity of an optical communication channel. Generally, the capacity of the optical communication channel is increased by increasing the transmission bandwidth. An increase in the transmission bandwidth is achieved when conventional high-frequency optical devices or electro-optical devices such as an analog-to digital converter (ADC), a digital-to-analog converter (DAC), or a Mach-Zehnder modulator (MZM) may. operate at a maximum possible capacity. This further requires the conventional DAC (or ADC) to have the highest possible sample rate. Moreover, a type of a DAC (or an ADC) architecture is proposed conventionally, for an ultra-wideband optical communication system. For example, a multiple time interleaving (TI) digital-to-analog converters (DACs) connected in parallel and with additional analog multiplexer (AMUX), also known as a conventional TI (AMUX)-DAC architecture. The conventional TI (AMUX)-DAC architecture includes multiple DACs (or ADCs) connected in parallel, and each DAC (or ADC) is known as a sub-DAC (or a sub-ADC). Each sub-DAC samples and holds an input signal (e.g., a digital signal) at a sampling rate (e.g. $Fs_{sub-DAC}$ (i.e., a sampling frequency of a sub-DAC)). In the conventional TI (AMUX)-DAC architecture, a high frequency clock is distributed to each sub-DAC in such a way that a first sub-DAC samples the input signal at t=0 and a second sub-DAC samples the input signal at $t=2/(M \times Fs_{sub-DAC})$ and so on, where M is the number of input signals (i.e. the digital signals). The conventional TI (AMUX)-DAC architecture improves the transmission bandwidth of the ultra-wideband optical communication channel to a certain extent, however, this architecture is more complex and therefore, possesses various calibration (or equalization) imperfections (or errors). Due to the calibration (or equalization) imperfections, there are different kind of distortions and mismatches. For example, mismatches in gain and time delay, offset errors between different sub-DACs, non-linearity of each sub-DAC, thermal noise and quantization noise. All these distortions and mismatches further result into a degradation in effective number of bits (ENOB) of the conventional TI (AMUX)-DAC architecture and limit the spectral efficiency of the ultra-wideband optical communication system. The calibration imperfections such as non-linearity and thermal noise can significantly reduce (e.g. by 20%) the effective resolution of the conventional TI (AMUX)-DAC architecture.

Currently, certain approaches (or algorithms) have been proposed to compensate the various distortions and mismatches of the conventional TI (AMUX)-DAC architecture. The proposed approaches are categorized into two groups namely, a conventional foreground calibration (e.g., off-line) approach and a conventional background calibration (e.g., on-line) approach. The conventional foreground calibration approach implies that the conventional TI (AMUX)-DAC is taken off-line for a short period of time in order to induce a reference signal or to force the conventional TI (AMUX)-DAC architecture to enter into a known state. However, the conventional foreground calibration approach cannot compensate the drifts significantly due to variations in time, temperature, or supply voltage. The conventional background calibration approach works in "background" to estimate and correct various sources of mismatch. In the conventional background calibration approach, a few limitations are imposed on the input signal (i.e., the digital signal). For example, the input signal is required to follow a known statistical behavior so that the variations (or drifts) in the signal parameters can be easily tracked. However, the conventional background calibration approach is based on feedback requirements (e.g., high-frequency components or level of distortions) and have limited performance in case of low-cost solutions. Moreover, the conventional background calibration approach (e.g., a digital calibration approach) has an additional error of ±0.5 least significant bit (LSB) due to integral non-linearity (INL). Thus, there exists a problem of an inefficient high-speed TI (AMUX)-DAC architecture having calibration imperfections that manifests degradation in effective number of bits (ENOB) (i.e., reduced resolution) and spectral efficiency required for the ultra-wideband optical communication system.

Therefore, in light of the foregoing discussion, there exists a need to overcome the aforementioned drawbacks associated with the conventional TI (AMUX)-DAC architecture and the conventional calibration (or compensation) approaches.

SUMMARY

The embodiments seek to provide a signal processing apparatus for use in an ultra-wideband optical communication system or in a next generation optical communication system. The embodiments seek to provide a solution to the existing problem of an inefficient high-speed TI (AMUX)-DAC architecture having calibration imperfections that manifests degradation in effective number of bits (ENOB) (i.e., reduced resolution) and spectral efficiency required for the ultra-wideband optical communication system. An aim of the embodiments is to provide a solution that overcomes at least partially the problems encountered in prior art, and provides an improved TI (AMUX)-DAC architecture (i.e., the signal processing apparatus) with optimal calibration (or compensation) and which can be realized at low cost and also with improved effective number of bits (ENOB) and spectral efficiency for use in the ultra-wideband optical communication system or in the next generation optical communication system.

In one aspect, the embodiments provide a signal processing apparatus including a plurality of time-interleaving digital-to-analog converters (sub-DACs) each configured to sample a digital input signal at a preset sub-DAC sample frequency, and to generate an analog sub-DAC output signal. The signal processing apparatus further includes an analog multiplexer configured to sample the plurality of sub-DAC output signals at a preset multiplexer clock frequency, and to generate a multiplexer output signal. The signal processing apparatus further includes a local analog-to-digital converter, local ADC, configured to receive the multiplexer output signal and generate a digital feedback signal. The signal processing apparatus further includes a digital compensation engine configured to receive the digital feedback signal from the local ADC and determine one or more distortion compensation parameters based on a comparison of the digital feedback signal with the digital input signal. The signal processing apparatus further includes a digital pre-processing stage configured to receive the one or more distortion compensation parameters from the digital compensation engine and perform distortion compensation pre-processing on the digital input signal.

The signal processing apparatus of the embodiments provides an improved high-speed time interleaved digital-to-analog converter (TI DAC (or TI (AMUX)-DAC)) architecture with accurate calibration (or compensation) based on estimation and correction of digital distortion parameters along with compensation of analog parameters also. The signal processing apparatus uses an improved background (i.e., on-line) calibration approach (or algorithm) to align the gain of each sub-DAC, timing mismatches in a mixed-mode domain (i.e., analog as well as digital modes), and memory less non-linear distortions of each sub-DAC as well. The signal processing apparatus uses feedback from the local ADC and hence, does not have any significant requirements on the feedback path in comparison to the conventional background calibration approach. The apparatus uses a low-cost feedback solution for adaptation. The signal processing apparatus enables the high-speed TI DAC (or the TI (AMUX)-DAC) architecture to have an improved resolution in terms of significantly increased effective number of bits (ENOB) and an improved spectral efficiency for use in an ultra-wideband optical communication system or in a next generation optical communication system.

In an implementation form, the digital pre-processing stage is configured to perform the distortion compensation pre-processing online.

The online pre-processing of distortion compensation provides a low-cost compensation solution. This further results in a significant increase in the effective number of bits (ENOB) that indicates an improved resolution in the signal processing apparatus.

In a further implementation form, the distortion compensation parameters include one or more sub-DAC sample frequency parameters.

The one or more sub-DAC sample frequency parameters are used to compensate the timing mismatches among different sub-DACs of the signal processing apparatus.

In a further implementation form, the signal processing apparatus further includes a sub-DAC time-delay controller, configured to receive the one or more sub-DAC sample frequency parameters, and to adjust a respective time-delay for each sub-DAC.

The sub-DAC time-delay controller adjusts the time-delay for each sub-DAC based on the one or more sub-DAC sample frequency parameters and hence, compensates the timing mismatches to a significant extent.

In a further implementation form, the distortion compensation parameters include one or more sub-DAC non-linearity parameters, and the digital compensation engine is configured to determine the sub-DAC non-linearity parameters based on parameters of a memory-less spline digital pre-distorter (DPD) model.

The memory-less spline digital pre-distorter (DPD) reduces the influence of memory-less non-linear distortions on the performance of signal processing apparatus and compensates the non-linear of DAC take different non-linearities between different sub-DAC into account.

In a further implementation form, the distortion compensation parameters include one or more sub-DAC gain parameters.

The one or more sub-DAC gain parameters are used to align the gain of each sub-DAC in the digital domain as well as in the analog domain (i.e., a mixed mode domain).

In a further implementation form, the distortion compensation parameters include one or more sub-DAC voltage offset parameters.

The one or more sub-DAC voltage offset parameters are used to compensate the offset errors associated with each sub-DAC in the digital domain as well as in the analog domain (i.e., the mixed mode domain).

In a further implementation form, the signal processing apparatus further includes a single tone generator configured to output a single frequency sample tone to the digital pre-processing stage, and a power detector configured to receive the multiplexer output signal and generate a power feedback signal. The digital compensation engine is configured to receive the power feedback signal from the power detector and determine one or more of the sub-DAC voltage offset parameters based on a comparison of the power feedback signal with the single frequency sample tone.

The feedback from the power detector provides a local narrow feedback to the digital compensation engine and does not have any feedback requirements which further result in low cost.

In a further implementation form, the single tone generator is configured to output the single frequency sample tone while the digital input signal is not input to the digital pre-processing stage.

In a further implementation form, the signal processing apparatus further includes a sub-DAC voltage controller, configured to receive the one or more sub-DAC gain parameters and/or sub-DAC voltage offset parameters, and to adjust a respective gain and/or voltage offset for each sub-DAC.

The sub-DAC voltage controller adjusts the gain and the voltage offset for each sub-DAC based on the one or more sub-DAC gain parameters and the one or more sub-DAC voltage offset parameters, respectively, and hence, compensates the gain mismatches and the offset errors of each sub-DAC.

In a further implementation form, the local ADC is configured to sample the multiplexer output signal at a preset sampling frequency which is substantially smaller than the multiplexer clock frequency.

The local ADC samples the multiplexer output signal at the preset sampling frequency which is substantially smaller than the multiplexer clock frequency for adaptation of distortion compensation parameters.

In a further implementation form, the signal processing apparatus further includes a pseudorandom noise generator configured to generate noise in an out-of-band region of the digital input signal.

The generated noise in the out-of-band region of the digital input signal increases the precision of distortion parameters estimation and avoids in-band signal-to-noise ratio degradation, if any.

It has to be noted that all devices, elements, circuitry, units and means could be implemented in the software or hardware elements or any kind of combination thereof. All steps which are performed by the various entities as well as the functionalities described to be performed by the various entities are intended to mean that the respective entity is adapted to or configured to perform the respective steps and functionalities. Even if, in the following description of the embodiments, a functionality or step to be performed by external entities is not reflected in the description of a detailed element of that entity which performs that step or functionality, it should be clear for a skilled person that these methods and functionalities can be implemented in respective software or hardware elements, or any kind of combination thereof. It will be appreciated that features of the embodiments are susceptible to being combined in various combinations without departing from the scope of the embodiments.

Additional aspects, advantages, features and objects of the embodiments would be made apparent from the drawings and the detailed description of the illustrative implementations.

BRIEF DESCRIPTION OF THE DRAWINGS

The summary above, as well as the following detailed description of illustrative embodiments, is better understood when read in conjunction with the appended drawings. For the purpose of illustrating the embodiments, exemplary constructions of the embodiments are shown in the drawings. However, the embodiments are not limited to methods and instrumentalities disclosed herein. Moreover, those in the art will understand that the drawings are not to scale. Wherever possible, like elements have been indicated by identical numbers.

Embodiments will now be described, by way of example only, with reference to the following diagrams where.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF THE EMBODIMENTS

The following detailed description illustrates embodiments and ways in which they can be implemented. Although some modes of carrying out the embodiments have been provided, those skilled in the art would recognize that other embodiments are also possible.

Figure 1:
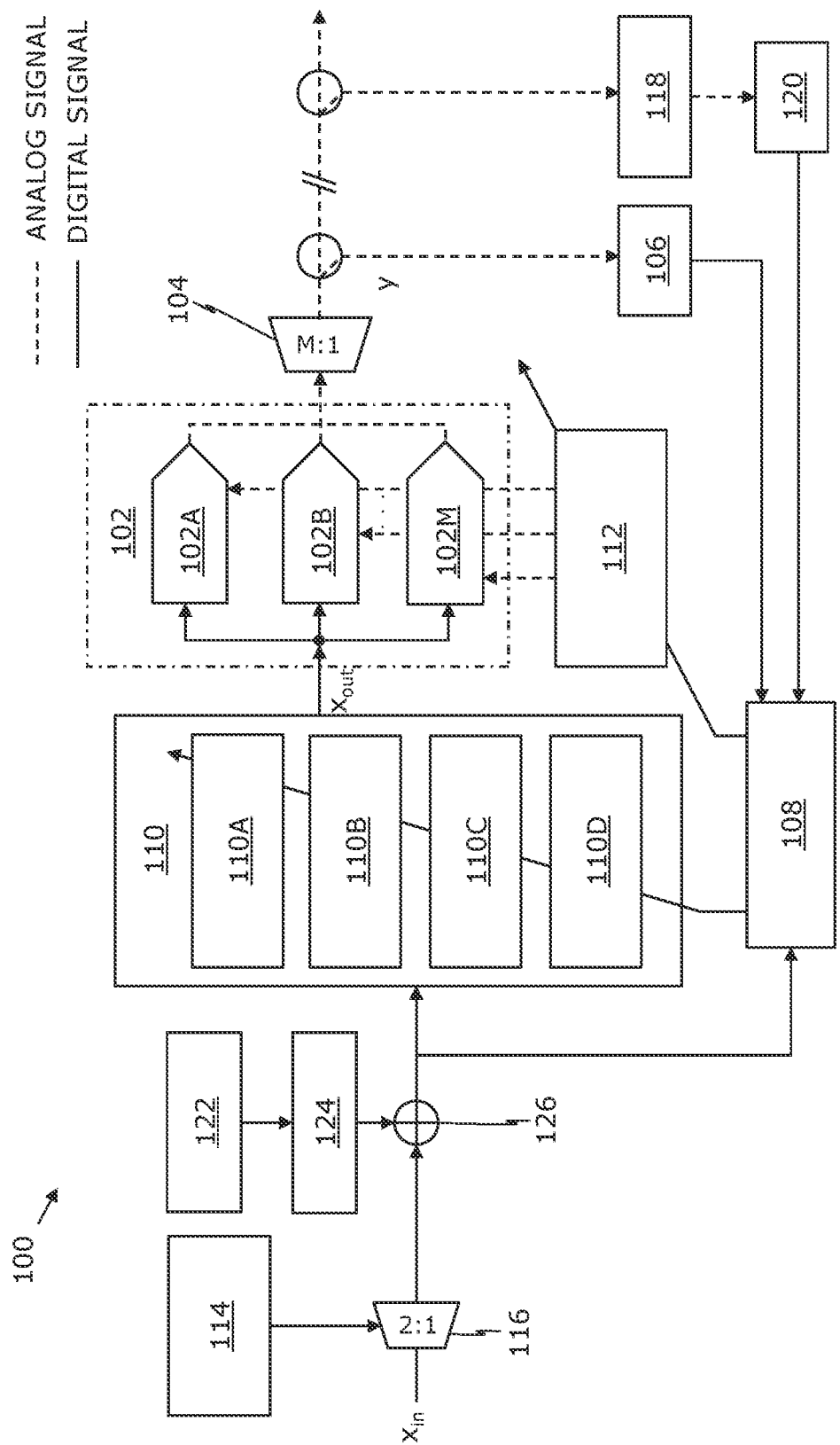
FIG. 1 is a circuit diagram of a signal processing apparatus, in accordance with an embodiment.

FIG. 1 is a circuit diagram of a signal processing apparatus, in accordance with an embodiment. With reference to FIG. 1, there is shown a circuit architecture of a signal processing apparatus 100 that includes a plurality of time-interleaving digital-to-analog converters (TI DACs) 102, an analog multiplexer (AMUX) 104, a local analog-to-digital converter (local ADC) 106, a digital compensation engine 108, a digital pre-processing stage 110, a controller 112, a single tone generator 114, a multiplexer 116, a power detector 118, an analog-to-digital converter (ADC) 120, a pseudo random binary sequence (PRBS) generator 122, a high pass filter 124 and an adder 126. The solid lines used in the signal processing apparatus 100 represent digital signals and the dotted lines represent analog signals.

Each of the plurality of time-interleaving digital-to-analog converters (TI-DACs) 102 includes suitable logic, circuitry, interfaces and/or code that is configured to sample a digital input signal (i.e. $x_{in}$) at a preset sub-DAC sample frequency, and to generate an analog sub-DAC output signal. The plurality of time-interleaving digital-to-analog converters (TI-DACs) 102 includes a first sub-DAC 102A, a second sub-DAC 102B, and a M-th sub-DAC 102M. The plurality of time-interleaving digital-to-analog converters (TI-DACs) 102 is represented by a dashed rectangular box, which is used for illustration purpose only and do not form a part of circuitry.

The analog multiplexer (AMUX) 104 includes suitable logic, circuitry, interfaces and/or code that is configured to sample the plurality of sub-DAC 102 output signals at a preset multiplexer 104 clock frequency, and to generate a multiplexer 104 output signal (i.e. y). The analog multiplexer (AMUX) 104 is a M:1 multiplexer which indicates that there are M inputs to the analog multiplexer (AMUX) 104 and is only one output. The M inputs to the analog multiplexer (AMUX) 104 correspond to output signals (i.e.

analog signals) from each sub-DAC of the plurality of TI-DACs 102. The output signal (y) from the analog multiplexer (AMUX) 104 is also an analog signal.

The local analog-to-digital converter (local ADC) 106 includes suitable logic, circuitry, interfaces and/or code that is configured to receive the multiplexer 104 output signal (y) and generate a digital feedback signal. The local ADC 106 performs an analog-to-digital conversion of the multiplexer 104 output signal (y) and generates the digital feedback signal that is further used for compensation of time interleaving (TI) gain and timing mismatches of each sub-DAC.

The digital compensation engine 108 includes suitable logic, circuitry, interfaces and/or code that is configured to receive the digital feedback signal from the local ADC 106 and determine one or more distortion compensation parameters (i.e., $\varphi_1, \ldots, \varphi_M, g_1, \ldots, g_M$, offset$_1$, ..., offset$_M$, $b_{kp}^1, \ldots b_{kp}^M$) based on a comparison of the digital feedback signal with the digital input signal ($x_{in}$). The one or more distortion compensation parameters (i.e., $\varphi_1, \ldots, \varphi_M$, $g_1, \ldots, g_M$, offset$_1$, ..., offset$_M$, $b_{kp}^1, \ldots b_{kp}^M$) are used for compensation of various calibration (or equalization) imperfections. For example, time interleaved linear distortions such as gain mismatches (i.e., $g_1, \ldots, g_M$) of each sub-DAC, timing mismatches (i.e. $\varphi_1, \ldots, \varphi_M$), offset errors (i.e. offset$_1$, ..., offset$_M$) and memory-less non-linear (NL) distortions (i.e., $b_{kp}^1, \ldots b_{kp}^M$). The digital compensation engine 108 may be a digital compensation circuit. In another embodiment, the digital compensation engine 108 may be a digital calibration engine.

The digital pre-processing stage 110 includes suitable logic, circuitry, interfaces and/or code that is configured to receive the one or more distortion compensation parameters (i.e., $\varphi_1, \ldots, \varphi_M, g_1, \ldots, g_M$, offset$_1$, ..., offset$_M$, $b_{kp}^1, \ldots b_{kp}^M$) from the digital compensation engine 108 and perform distortion compensation pre-processing on the digital input signal ($x_{in}$). The digital pre-processing stage 110 may be referred to as a digital pre-processing circuit. The digital pre-processing stage 110 (i.e. a digital pre-processing circuit) includes a gain mismatch compensation circuit 110A, a timing mismatch compensation circuit 110B, an offset compensation circuit 110C and a non-linear (NL) pre-compensation circuit 110D. A digital output signal (i.e. of the digital pre-processing stage 110 after applying the one or more distortion compensation parameters is communicated to each sub-DAC of the plurality of TI-DACs 102 for distortion compensation of each sub-DAC.

The controller 112 includes suitable logic, circuitry, interfaces and/or code that is configured to adjust a respective time-delay, gain and voltage offset for each sub-DAC based on the one or more distortion compensation parameters from the digital compensation engine 108. The controller 112 may be referred to as a time-delay controller for adjusting the respective time-delay (i.e., $\varphi_1, \ldots, \varphi_M$) for each sub-DAC. The controller 112 may also be referred to as a voltage controller to adjust the respective gain (i.e., $g_1, \ldots, g_M$) and/or voltage offset (i.e., offset$_1$, ..., offset$_M$) for each sub-DAC. Therefore, the controller 112 may function as the voltage and the time-delay controller as well.

The single tone generator 114 includes suitable logic, circuitry, interfaces and/or code that is configured to output a single frequency sample tone to the digital pre-processing stage 110. The single tone generator 114 may also be referred as a signal tone generator.

The multiplexer 116 may be a 2:1 multiplexer having two inputs and one output.

The power detector 118 includes suitable logic, circuitry, interfaces and/or code that is configured to receive the multiplexer 104 output signal (i.e., y) and generate a power feedback signal. The power feedback signal is used for offset parameters estimation and correction of each sub-DAC.

The analog-to-digital converter (ADC) 120 includes suitable logic, circuitry, interfaces and/or code that is configured to convert the power feedback signal from analog domain to the digital domain. The ADC 120 further communicates the power feedback signal in the digital domain to the digital compensation engine 108.

The pseudo random binary sequence (PRBS) generator 122 includes suitable logic, circuitry, interfaces and/or code that is configured to generate noise in an out-of-band region of the digital input signal (i.e., $x_{in}$). The generated noise in the out-of-band region is used to create high level of TI error in low frequency region. For example, the digital input signal ($x_{in}$) may be oversampled. In that case, the TI error may be a frequency-shifted input signal and therefore, it becomes difficult to detect errors based on a narrow feedback from the local ADC 106. The reason is the level of TI error in the low-frequency region is very low and therefore, an additional noise in the out-of-band region of the digital input signal ($x_{in}$) is added to use an improved background calibration approach to compensate the TI error without in-band signal-to-noise degradation.

The high pass filter (HPF) 124 includes suitable logic, circuitry, interfaces and/or code that is configured to remove the high frequencies, if any, in the generated noise in the out-of-band region of the digital input signal ($x_{in}$).

The adder 126 includes suitable logic, circuitry, interfaces and/or code that is configured to add the generated noise in the out-of-band region of the digital input signal to the digital input signal ($x_{in}$).

In operation, the signal processing apparatus 100 performs an identification and compensation of time interleaving (TI) errors, such as timing and gain mismatches, offset errors and non-linear (NL) distortions more accurately as compared to conventional TI (AMUX)-DAC architecture. The digital compensation engine 108 is configured to determine the one or more distortion compensation parameters (i.e., $\varphi_1, \ldots, \varphi_M, g_1, \ldots, g_M, b_{kp}^1, \ldots b_{kp}^M$) based on the comparison of the digital feedback signal (i.e., a local narrow feedback) and the digital input signal ($x_{in}$). The digital feedback signal (i.e., the local narrow feedback) is generated by the local ADC 106 based on the analog multiplexer (AMUX) 104 output signal (y). The digital compensation engine 108 also uses the power feedback signal which is generated by the power detector 118 and the ADC 120 for estimation of the offset parameters (offset$_1$, ..., offset$_M$). The digital feedback signal from the local ADC 106 may not be used for offset parameters estimation. The one or more distortion compensation parameters (i.e., $\varphi_1, \ldots, \varphi_M, g_1, \ldots, g_M$, offset$_1$, ..., offset$_M$) are communicated to the controller 112 which further adjusts the time-delay (i.e., $\varphi_1, \ldots, \varphi_M$), the gain (i.e., $g_1, \ldots, g_M$) and the voltage offset (i.e., offset$_1$, ..., offset$_M$) for each sub-DAC, respectively. The digital pre-processing stage 110 is configured to receive the one or more distortion compensation parameters (i.e., $\varphi_1, \ldots, \varphi_M, g_1, \ldots, g_M$, offset$_1$, ..., offset$_M$, $b_{kp}^1, \ldots b_{kp}^M$) to perform distortion compensation pre-processing on the digital input signal ($x_{in}$). A digital output signal (i.e., of the digital pre-processing stage 110 after applying the one or more distortion compensation parameters is communicated to each sub-DAC of the plurality of time-interleaving digital-to-analog converters (TI-DACs) 102 for distortion compensation of each sub-DAC.

In accordance with an embodiment, the digital pre-processing stage 110 is configured to perform the distortion compensation pre-processing online. In the online distortion compensation pre-processing, the local narrow feedback from the local ADC 106 and the power detector 118 is used which further results in a reduced cost of the signal processing apparatus 100.

In accordance with an embodiment, the distortion compensation parameters include one or more sub-DAC sample frequency parameters. The one or more sub-DAC sample frequency parameters are used to compensate the timing mismatches associated with each sub-DAC and is described in detail, for example, in FIG. 2.

In accordance with an embodiment, the signal processing apparatus 100 further includes a sub-DAC time-delay controller 112, configured to receive the one or more sub-DAC sample frequency parameters, and to adjust a respective time-delay for each sub-DAC. The controller 112 in the signal processing apparatus 100 is configured as the sub-DAC time-delay controller which receives the one or more sub-DAC sample frequency parameters from the digital compensation engine 108 and adjusts the respective time-delay (i.e., $\varphi_1, \ldots, \varphi_M$) for each sub-DAC in the digital as well in the analog domain. The estimation of the one or more sub-DAC sample frequency parameters in the digital domain is described in detail, for example, in FIG. 2 and for the analog domain in FIG. 4, respectively.

In accordance with an embodiment, the distortion compensation parameters include one or more sub-DAC non-linearity parameters, and the digital compensation engine 108 is configured to determine the sub-DAC non-linearity parameters based on parameters of a memory-less spline digital pre-distorter (DPD) model. To determine the one or more sub-DAC non-linearity parameters (i.e., $b_{kp}^1, \ldots b_{kp}^M$) based on the memory-less spline digital pre-distorter (DPD) model, the digital compensation engine 108 uses the local narrow feedback form the local ADC 106. The memory-less spline digital pre-distorter (DPD) model, described in detail, for example, in FIG. 2.

In accordance with an embodiment, the distortion compensation parameters include one or more sub-DAC gain parameters. The one or more sub-DAC gain parameters (i.e., $g_1, \ldots, g_M$) are used to align the gain of each sub-DAC. The estimation and correction of gain mismatches of each sub-DAC is described in detail, for example, in FIG. 2.

In accordance with an embodiment, the distortion compensation parameters include one or more sub-DAC voltage offset parameters. The one or more sub-DAC voltage offset parameters are used to compensate the offset errors of each sub-DAC in the mixed-mode domain (i.e., digital and analog domains). The estimation and correction of offset errors in the mixed domain is described in detail, for example, in FIG. 3A.

In accordance with an embodiment, the digital compensation engine 108 is configured to receive the power feedback signal from the power detector 118 and determine one or more of the sub-DAC voltage offset parameters based on a comparison of the power feedback signal with the single frequency sample tone. The offset errors associated with each sub-DAC results in multiple tones at certain frequencies and are known as spurious signals. Based on the comparison of the power feedback signal from the power detector 118 with the single frequency sample tone from the signal tone generator 114, test signals at frequencies close to the offset spurious signal frequencies are generated in order to compensate their effect (i.e., effect of offset spurious signal frequencies). The test signals may also be referred as beat signals and are described in detail, for example, in FIG. 3B.

In accordance with an embodiment, the single tone generator 114 is configured to output the single frequency sample tone while the digital input signal is not input to the digital pre-processing stage 110. The digital input signal ($x_{in}$) is multiplexed with the single frequency sample tone generated by the single tone generator 114 by use of the multiplexer (i.e., 2:1 multiplexer) 116. Thereafter, the noise generated by the pseudo random binary sequence (PRBS) generator 122 and the high pass filter (HPF) 124 in the out-of-band region of the digital input signal ($x_{in}$) is added to the output of the multiplexer 116 by use of the adder 126. After all this signal processing, the digital input signal is applied as input to the digital pre-processing stage 110 for distortion compensation.

In accordance with an embodiment, the signal processing apparatus 100 further includes a sub-DAC voltage controller 112, configured to receive the one or more sub-DAC gain parameters and/or sub-DAC voltage offset parameters, and to adjust a respective gain and/or voltage offset for each sub-DAC. The controller 112 may also be referred as the sub-DAC voltage controller which adjusts the respective gain (i.e., $g_1, \ldots, g_M$) and voltage offset (i.e., $\text{offset}_1, \ldots, \text{offset}_M$) associated with each sub-DAC for compensation of gain mismatches and offset errors, respectively.

In accordance with an embodiment, the local ADC 106 is configured to sample the multiplexer 104 output signal at a preset sampling frequency which is substantially smaller than the multiplexer 104 clock frequency. The local ADC 106 samples the multiplexer 104 output signal at the preset sampling frequency higher than the multiplexer 104 clock frequency for adaptation.

Thus, the signal processing apparatus 100 represents the improved high-speed time interleaved digital-to-analog converter with analog multiplexer (TI (AMUX)-DAC) architecture, which accurately compensates time interleaved linear and non-linear distortions. The signal processing apparatus 100 uses the local narrow feedback provided by the local ADC 106 and the power detector 118 and does not have any requirements on the feedback path. Moreover, the signal processing apparatus 100 provides a low-cost feedback solution. The one or more distortion compensation parameters are estimated based on the local narrow feedback which are used to compensate the gain and timing mismatches, offset errors and non-linear distortions. The memory-less spline digital pre-distorter (DPD) model reduces the effect of the memory-less non-linearity on the performance of the signal processing apparatus 100 and is used for compensating the non-linearity distortions of each sub-DAC. Therefore, the signal processing apparatus 100 has an improved resolution in terms of significantly increased effective number of bits (ENOB) and also, an improved spectral efficiency for use in the ultra-wideband optical communication system or in the next generation optical communication system, for example, in an optic transmission module, described in detail, for example, in FIG. 5.

Figure 2:
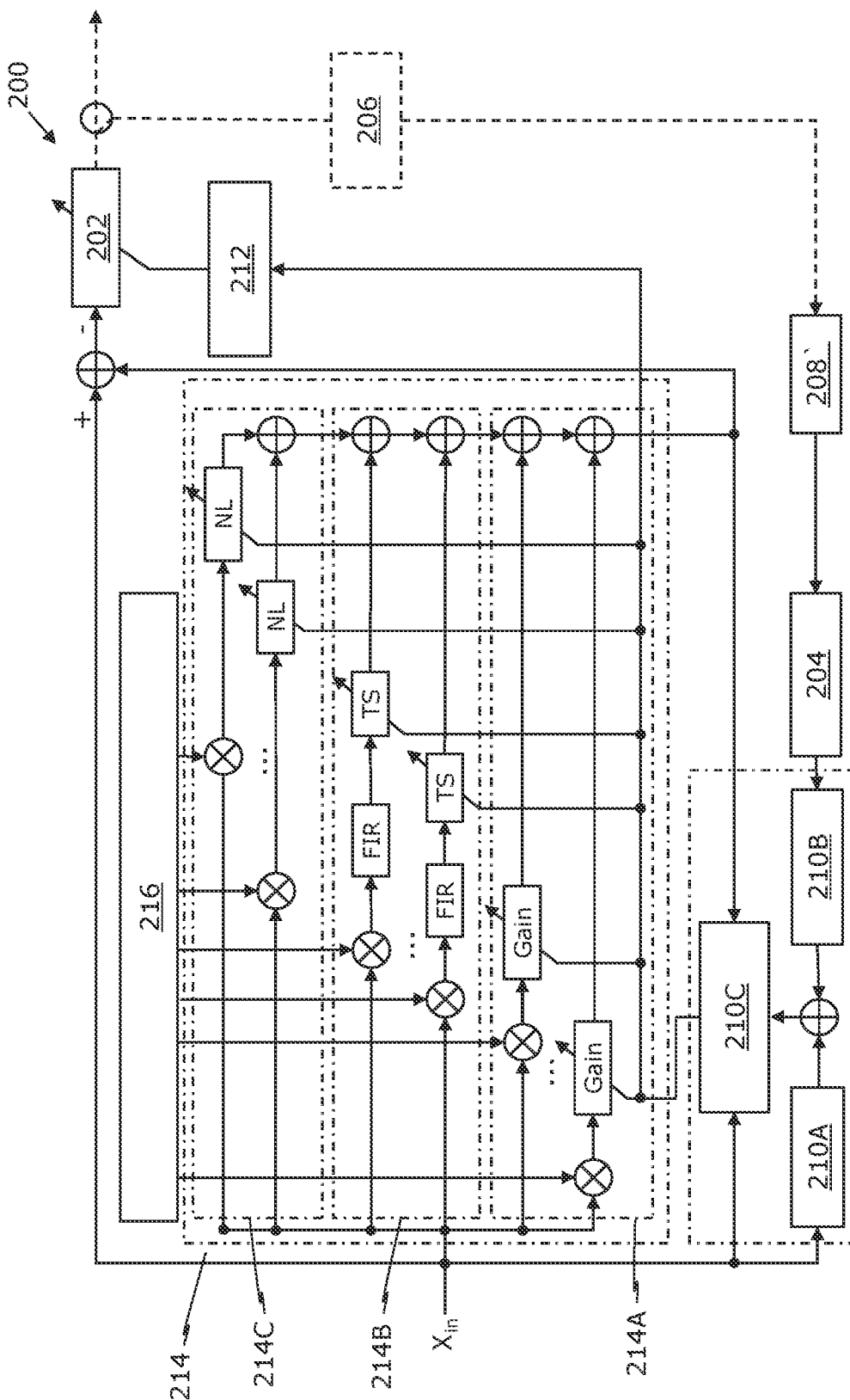
FIG. 2 is a circuit diagram of a signal processing apparatus with estimation and correction of distortion parameters, in accordance with another embodiment.

FIG. 2 is a circuit diagram of a signal processing apparatus with estimation and correction of distortion parameters, in accordance with another embodiment. FIG. 2 is described in conjunction with elements from FIG. 1. With reference to FIG. 2, there is shown a circuit architecture of a signal processing apparatus 200 with estimation and correction of distortion parameters in a mixed domain (i.e., digital as well as analog domain). The signal processing apparatus 200 includes a plurality of time-interleaving digital-to-analog converters (TI DACs) 202, a local analog-to-digital converter (local ADC) 204, an analog feedback path 206, a low pass filter (LPF) 208, a digital compensation engine 210, a controller 212, a digital pre-processing circuit 214 and a signal tone generator 216. The digital compensation engine 210 includes a low pass filter (LPF) 210A, an up sampler 210B and an adaptation block 210C. The digital pre-processing circuit 214 includes a gain mismatches compensation circuit 214A, a timing mismatches compensation circuit 214B and a non-linear (NL) pre-compensation circuit 214C. The solid lines used in the signal processing apparatus 200 represent digital signals and the dotted lines represent analog signals. However, the digital compensation engine 210 and the digital pre-processing circuit 214 are represented by dashed rectangular boxes, which are used for illustration purpose only and do not form a part of circuitry. The signal processing apparatus 200 may also be referred as the TI (AMUX)-DAC architecture which has been described in detail, for example, in FIG. 1.

In the signal processing apparatus 200, the plurality of time-interleaving digital-to-analog converters (TI DACs) 202 corresponds to the plurality of time-interleaving digital-to-analog converters (TI DACs) 102 (of FIG. 1). Similarly, the local ADC 204, the digital compensation engine 210, the controller 212, the digital pre-processing circuit 214 and the signal tone generator 216 corresponds to the local ADC 106, the digital compensation engine 108, the controller 112, the digital pre-processing circuit 110 and the signal tone generator 114 of the signal processing apparatus 100 (of FIG. 1).

In the signal processing apparatus 200, the gain and timing mismatches and non-linearity parameters associated with each sub-DAC of the plurality of TI DAC 202 are estimated and then compensated in the mixed domain. The estimation and correction of gain and timing mismatches are performed by use of the gain mismatches compensation circuit 214A and the timing mismatches compensation circuit 214B, respectively, of the digital pre-processing circuit 214. For this, an improved background (i.e., on line) approach is used in which a local narrow feedback in terms of an analog feedback signal (e.g., a portion of an analog output signal of the signal processing apparatus 200) is applied to the local ADC 204 through the analog feedback path 206 and the LPF 208.

Generally, the gain of a digital-to-analog converter (DAC) is represented by a slope of the best fit line of the DAC transfer function. In a case of a single-channel DAC, the gain error can change amplitude of output signal of the single-channel DAC but does not degrade the dynamic performance of the DAC. However, in another case of a multi-channel DAC (e.g., a TI (MUX)-DAC) the gain mismatches may lead to spurious signals (i.e., undesired signals) which depend on the frequency of input signal. The gain mismatches are considered as an error source for the multi-channel DAC (i.e., the TI (MUX)-DAC) and may not exist in the single-channel DAC. Similarly, the timing mismatches are also considered as an additional error source for the multi-channel DAC (i.e., the TI (MUX)-DAC). The clock signals for each sub-DAC in the multi-channel DAC (i.e., the TI (MUX)-DAC) may be generated on-chip by dividing a high frequency clock. In an ideal case, the clock signals for each sub-DAC are uniformly distributed in time. However, in the timing mismatches, the clock signals associated with each sub-DAC deviate from the ideal case and are spaced non-uniformly. The gain and timing mismatches may be processed in two steps that is, the gain and timing mismatches estimation followed by error correction. Therefore, the gain and timing mismatches estimation is described at first. The output signal of the signal processing apparatus 200 (or the M-channel TI (MUX)-DAC) can be described as a discrete time-varying filter with M-periodic impulse response in the equation (equation 1 and equation 2)

$$Y(\omega) = \sum_{k=0}^{M-1} \tilde{H}_k(\omega) X\left(\omega - k\frac{2\pi}{M}\right) \quad (1)$$

$$\tilde{H}_k(\omega) = \frac{1}{M} \sum_{m=0}^{M-1} H_m(\omega) e^{-ik\frac{2\pi}{M}m} \quad (2)$$

where, Y is the analog output signal in the frequency domain, X is the digital input signal in the frequency domain to the signal processing apparatus 200 (or the M-channel TI (AMUX)-DAC), $H_m$ is the frequency response of Mth sub-DACs of the plurality of TI-DAC 202, ω—angular frequency. The equation 1 can be represented in a more complicated form in the equation (equation 3)

$$Y(\omega_1, \ldots, \omega_p) = \qquad (3)$$
$$\sum_{k=0}^{M-1} H_{k,p}(\omega_1, \ldots, \omega_p) \prod_{l=1}^{p} \sum_{m=0}^{M-1} X(\omega_l - m\frac{2\pi}{M}) e^{-ik\frac{2\pi}{M}m}$$

where, $H_{k, p}$ is frequency-domain representation of a $p^{th}$—order Volterra kernel for a $k^{th}$ DAC. There is one assumption that inverse sinc filter is used during estimation step. For the gain and timing mismatches, the equation 1 can be rewritten in the form of the equation (equation 4)

$$H_m(\omega) = g_m e^{i\omega \tau_m} \quad (4)$$

where $g_m$ is gain error of a Mth sub-DAC in the plurality of TI DAC 202, $\tau_m$ is timing mismatches of the Mth sub-DAC. Since, in the TI DAC 202, the relative time offsets are small compared to the sampling period of each sub-DAC, therefore, Taylor's series can be used in the equation (equation 5, equation 6 and equation 7)

$$\tilde{H}_k(\omega) = \frac{1}{M} \Sigma_{m=0}^{M-1} g_m (1 + i\omega\phi_m) e^{-ik\frac{2\pi}{M}m} \quad (5)$$

$$\tilde{H}_k(\omega) = G_k + i\gamma_k \omega \quad (6)$$

$$g_m = \Sigma_{k=0}^{M-1} G_k e^{ik\frac{2\pi}{M}m}, \quad g_m \phi_m = \Sigma_{k=0}^{M-1} \gamma_k e^{ik\frac{2\pi}{M}m} \quad (7)$$

The equation 5 can be rewritten (equation 8) in the time domain by using the equation 7, $$y = C_1^T m[n]x[n] + C_2^T h_d * m[n]x[n] \quad (8)$$

where x is input signal to the signal processing apparatus 200, y is output signal of the signal processing apparatus 200, $$C_1 = \{G_0, \mathcal{R}(G_k), \mathcal{J}(G_k), \ldots, G_{\frac{M}{2}}\},$$

$C_2 = \{\gamma_0, \mathfrak{R}(\gamma_k), \mathfrak{I}(\gamma_k), \ldots \gamma_{M/2}\}$, $h_d$ is discrete-time differentiator, * represents convolution and $$m[n] = \{1, 2\cos\left(\frac{2\pi}{M}n\right), -2\sin\left(\frac{2\pi}{M}n\right), 2\cos\left(2\frac{2\pi}{M}n\right), -2\sin\left(2\frac{2\pi}{M}n\right), \ldots, (-1)^n\}$$

The equation 8 is used to find the gain and the timing mismatches. However, the local narrow feedback from the local ADC 204 with the sampling frequency ($Fs_{adc} << Fs_{dac}$) is used for adaptation by the adaptation block 210C of the digital compensation engine 210. The solution is obtained by solving the least square problem in the equation (equation 9)

$$\arg\min_{C_1 C_2} \|Y - (C_1^T m[n]Z[n] + C_2^T h_d * m[n]Z[n])\| \tag{9}$$

where Y is the local ADC 204 output signal, Z is the DAC (e.g., TI (AMUX)-DAC 200) input signal resampled on the local ADC 204 sample rate. The parameters $C_1$, $C_2$ are determined from the equation 9 and the gain and the timing mismatches parameters are recalculated by the adaptation block 210C of the digital compensation engine 210 from the equation 7. The recalculated gain and the timing mismatches parameters are communicated to the controller 212 to align the gain and timing mismatches of each sub-DAC of the plurality of TI DAC 202 to control the relative parameters. After gain and timing alignment, a few sub-DACs from the plurality of TI-DAC 202 can be used as reference sub-DACs (e.g., sub-DAC #1) in the equation (equation 10)

$$\begin{cases} g_m = g_m - g_1 \\ \phi_m = \phi_m - \phi_1 \end{cases} \tag{10}$$

where, $g_m$ is estimation gain error of the Mth sub-DAC, $\phi_m$ is estimation time error of the Mth sub-DAC. The estimated gain and timing mismatches parameters based on the equation 7 are described in detail, for example, in FIGS. 7C and 7D, respectively.

Additionally, in the signal processing apparatus 200, the non-linearity parameters associated with each sub-DAC of the plurality of TI DAC 202 are estimated and then compensated in the mixed domain. The estimation and correction of non-linearity parameters are performed in the non-linear (NL) pre-compensation circuit 214C of the digital pre-processing circuit 214. For non-linearity compensation, the local narrow feedback is used in the digital compensation engine 210. The local narrow feedback is provided by the local ADC 204 to the adaptation block 210C of the digital compensation engine 210.

Generally, the non-linearities (or the non-linear errors) of the TI DAC have a repetitive or a periodic nature and result into the generation of spurious tones (i.e., undesired signals) in the frequency spectrum of the digital representation of the analog input signal to the TI DAC. The non-linear errors in the TI DAC may be caused by the non-linear frequency response of amplifiers and switches. The non-linear errors further result into a non-uniform program voltage step size which in turn degrades the signal-to-noise ratio of the TI DAC. The difference in non-linearity of each sub-DAC in the TI DAC lead to different voltage step size for each sub-DAC and considered as an additional error source for the TI DAC (e.g., the TI (AMUX)-DAC). The non-linearity associated with each sub-DAC of the plurality of TI DAC 202 in the signal processing apparatus 200, is compensated by use of the memory-less spline digital pre-distorter (DPD) algorithm and the local narrow feedback from the local ADC 204. Based on the equation 1, the output of the memory-less spline digital pre-distorter (DPD) algorithm can be written to present the non-linearities for different sub-DACs in the equations (equation 11 and equation 12)

$$y(n) = x(n) + \sum_{k=0}^{M-1} f_k(x(n)) e^{ik\frac{2\pi}{M}n} \tag{11}$$

$$f_k(x(n)) = \sum_{p=0}^{P-1} b_{kp} SPL(x(n)) \tag{12}$$

where x(n) is the input signal in the digital domain, $b_{kp}$ are non-linear coefficients, P are number of splines, SPL(x) are spline functions. Splines SPLn(x) are numeric functions those are piecewise defined by polynomial functions. Degree of used polynomial functions defines spline order: first degree represents linear splines, second degree represents quadratic splines, third degree represents cubic splines and so on. By considering the local ADC 204 sampling rate, the least square problem can be formulated in the equation (equation 13)

$$\arg\min_{b_{kp}} \|Y - \sum_{k=0}^{M-1} \sum_{p=0}^{P-1} b_{kp} SPL(Z(n)) e^{ik\frac{2\pi}{M}n}\| \tag{13}$$

where Y is local ADC 204 output signal, Z is the DAC (e.g., TI (AMUX)-DAC 200) input signal resampled on the local ADC 204 sample rate. The equation 13 is the best fit line of the DAC (e.g., TI (AMUX)-DAC 200) non-linear transfer function. The non-linear model parameters $b_{kp}$ are used for the DAC (e.g., TI (AMUX)-DAC 200) non-linearity pre-compensation.

In this way, the gain and timing mismatches and non-linearity parameters are estimated and then compensated in the signal processing apparatus 200 (e.g., the TI (AMUX)-DAC). In this embodiment, the upsampler 210B is used in the digital compensation circuit 210, to upsample the output from the local ADC 204. In another embodiment, a down sampler may be used alternatively, to down sample an output signal from the low pass filter (LPF) 210B in the digital compensation circuit 210 instead of up sampling the output from the local ADC 204.

Figure 3A:
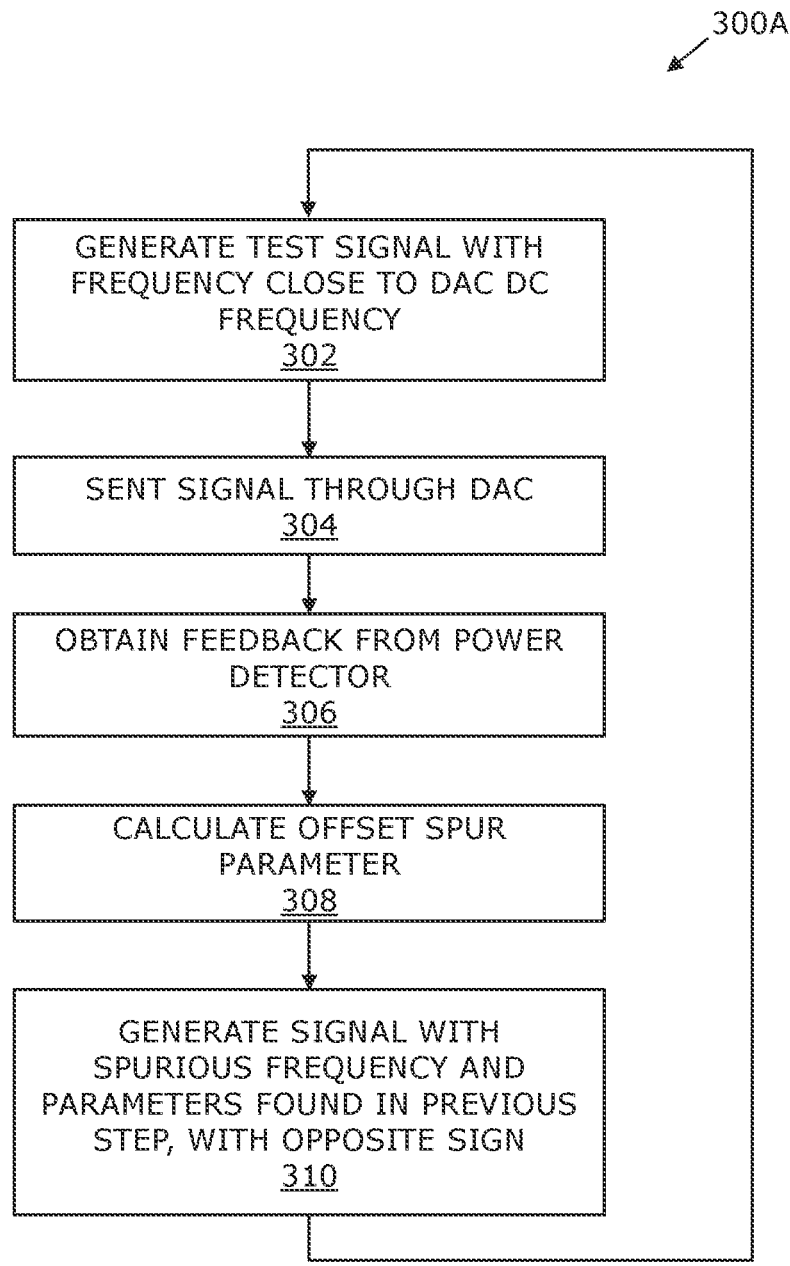
FIG. 3A is a flowchart that depict operations for spurious signal parameters estimation and correction, in accordance with an embodiment.

FIG. 3A is a flowchart that depict operations for spurious signal parameters estimation, in accordance with an embodiment. FIG. 3A is described in conjunction with elements from FIGS. 1 and 2. With reference to FIG. 3A, there is shown a method 300A for a step-by-step spurious signal parameters estimation by use of an improved foreground approach. The method 300A is executed by a signal processing apparatus, such as the signal processing apparatus 100 (of FIG. 1). The method 300A includes operations 302, 304, 306, 308 and 310.

Generally, an offset of a sub-DAC (e.g., the first sub-DAC 102A of FIG. 1) is defined as a static value which is added to an input signal to the sub-DAC. The offset errors are caused by offset values of amplifiers, comparators, switchers, etc. The offset errors (or mismatches) between various sub-DACs generate uniformly distributed tones in the frequency domain. The output signal of a M-channel linear TI-DAC system (e.g., the TI (AMUX)-DAC 100) can be represented in the presence of offset error by the equation (equation 14)

$$Y(\omega) = \sum_{k=0}^{M-1} \tilde{H}_k(\omega) Y\left(\omega - k\frac{2\pi}{M}\right) + \sum_{k=0}^{M-1} R_k \delta(j(\omega - 2\pi k/M)) \tag{14}$$

Where the second term represents the offset spurious signals in the frequency domain. For offset parameter estimation, a power feedback signal form the power detector (e.g., the power detector 118 of FIG. 1) is used, the reason is the local narrow feedback cannot compensate the spurious signals (or spurs). The offset errors result in multiple tones in the frequency domain as represented in the equation (equation 15)

$$0, \frac{Fs}{N}, \frac{2Fs}{N}, \frac{(N-1)Fs}{N} \qquad (15)$$

Therefore, in order to compensate the multiple tones (or spurious signals), an improved foreground approach is used. In the improved foreground (i.e., off-line) approach, test signals are generated with frequency close to the offset spurious signal frequency at operation 302 as expressed in the equation (equation 16)

$$|\omega_{dc\,m} - \omega_{test\,m}| < bw_{pd} \qquad (16)$$

where, $\omega_{dc\,m}$ is the offset spurious signal frequency, $\omega_{test\,m}$ is the test signal frequency, $bw_{pd}$ is the bandwidth of the power detector (e.g., the power detector 118 of FIG. 1).

At operation 304, the generated test signals are passed through the TI-DAC (e.g., the TI (AMUX)-DAC 100).

At operation 306, the power feedback signal is obtained from the power detector (e.g., the power detector 118 of FIG. 1). The power feedback signal may also be referred as a beat-frequency signal and represented by the equation (equation 17)

$$y = \Sigma_{i=1}^{M} (a_i + b_i)\cos(\Delta\omega_i t) + (a_i - b_i)\sin(\Delta\omega_i t) \qquad (17)$$

Where $a_i, b_i$ are in-phase and quadrature phase amplitudes of offset spurious signal, $\Delta\omega_i$ is a beat frequency signal. There is one assumption made that is the in-phase and quadrature phase amplitude of the test signal (or the beat signal) are normalized. The beat frequency signal from the power detector (e.g., the power detector 118 of FIG. 1) is described in detail, for example, in FIG. 3B.

At operation 308, the offset spur parameters are calculated to compensate the offset errors by solving the least square problem defined in the equation (equation 18)

$$\operatorname*{argmin}_{w_i, p_i} \|z - \Sigma_{i=1}^{M} w_i\cos(\Delta\omega_i t) + p_i\sin(\Delta\omega_i t)\| \qquad (18)$$

where, z is the power detector input signal, $\Delta\omega_i$ is beat frequency signal, $w_i, p_i$ is in-phase and quadrature phase amplitude.

At operation 310, a signal is generated with the spurious frequency and with the parameters calculated in the operation 308, and with the opposite sign. The operations (or steps) from 302 to 310 are repeated iteratively to obtain the desired accuracy. The spurious parameters calculated in the operation 308 can be converted into offset value by use of the equation 2.

Figure 3B:
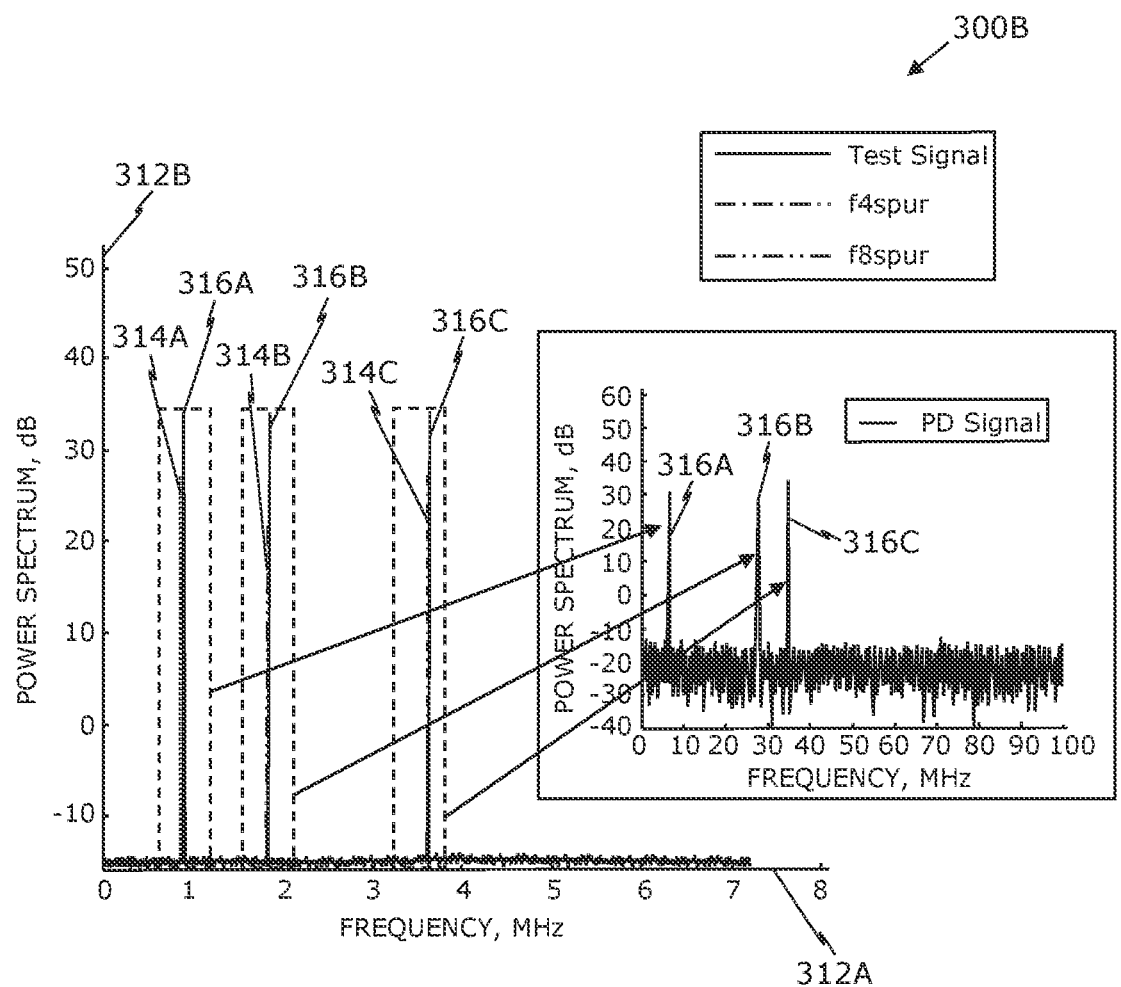
FIG. 3B is a graphical representation that illustrates beat signals from a power detector, in accordance with an embodiment.

FIG. 3B is a graphical representation that illustrates beat signals from a power detector, in accordance with an embodiment. FIG. 3B is described in conjunction with elements from FIGS. 1, 2, and 3A. With reference to FIG. 3B, there is shown a graphical representation 300B that illustrates beat signals from a power detector, such as the power detector 118 of FIG. 1. The beat signals may also be referred as test signals. The graphical representation 300B includes an X-axis 312A that represents frequency in MHz and a Y-axis 312B that represents power spectrum in dB.

In the graphical representation 300B, a first signal 314A, a second signal 314B and a third signal 314C (e.g., dotted signals) represent offset spurious signals which are generated as a result of the offset errors. And a fourth signal 316A, a fifth signal 316B and a sixth signal 316C (e.g., solid lines) represent beat signals (or test signals) from the power detector (e.g., the power detector 118 of FIG. 1) which are generated in order to compensate the effect of offset spurious signals (e.g., the first signal 314A, the second signal 314B and the third signal 314C).

Figure 4:
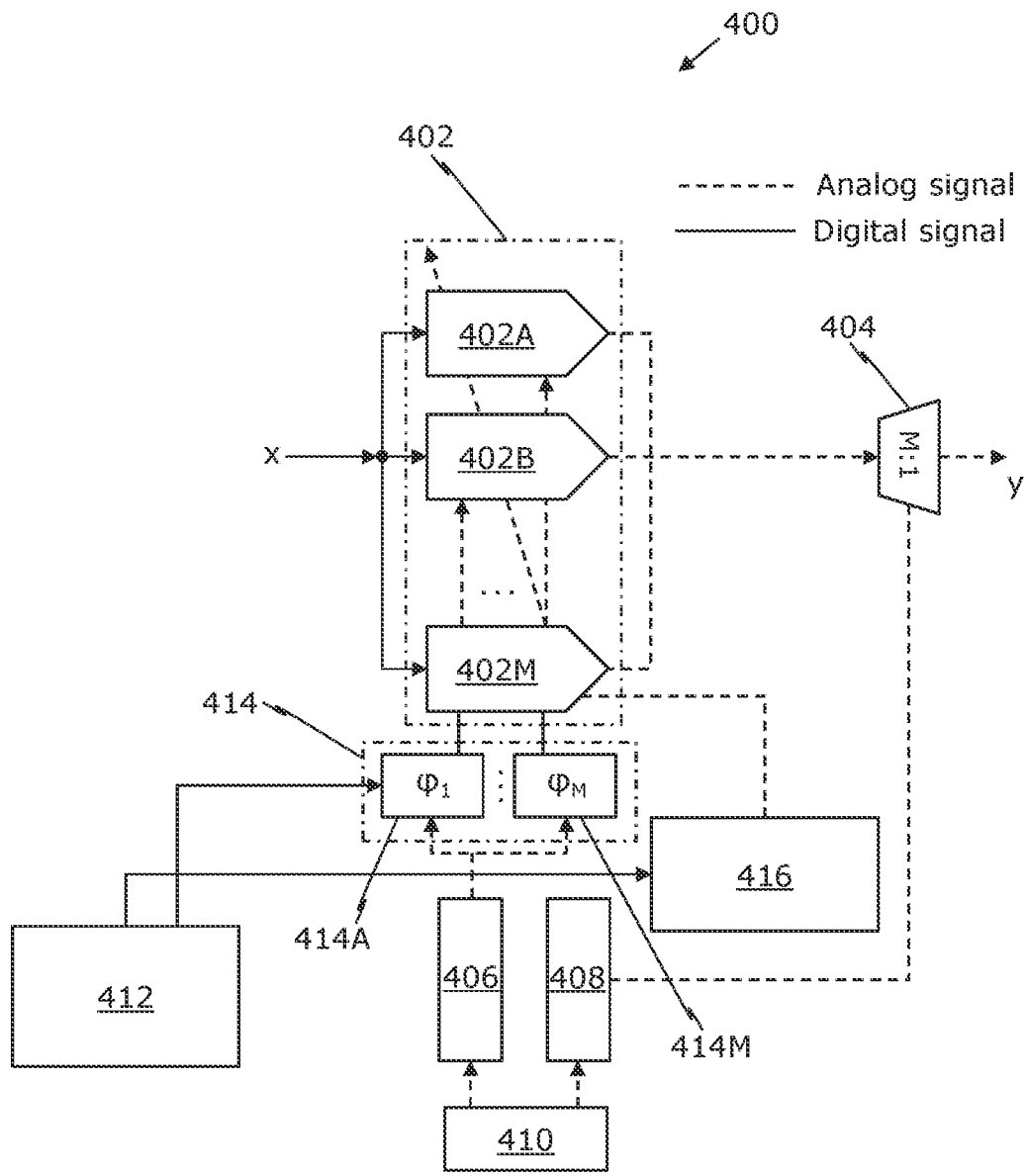
FIG. 4 is a circuit diagram of a signal processing apparatus with estimation and correction of distortion parameters, in accordance with another embodiment.

FIG. 4 is a circuit diagram of a signal processing apparatus with estimation and correction of distortion parameters, in accordance with another embodiment. FIG. 4 is described in conjunction with elements from FIGS. 1 and 2. With reference to FIG. 4, there is shown a circuit architecture of a signal processing apparatus 400 with estimation and correction of distortion parameters, for example, in the analog domain. The signal processing apparatus 400 includes a plurality of time-interleaving digital-to-analog converters (TI DAC) 402, an analog multiplexer (AMUX) 404, a high frequency clock 406 for the plurality of TI DAC, a multiplexer clock 408, a phase locked loop circuit (PLL) 410, a digital compensation engine 412, a plurality of clocks 414 and a voltage controller 416. The solid lines used in the signal processing apparatus 400 represent digital signals and the dotted lines represent analog signals. However, the plurality of time-interleaving digital-to-analog converters (TI DAC) 402 and the plurality of clocks 414 may be represented by dashed rectangular boxes, which are used for illustration only and do not form a part of the circuitry.

The plurality of time-interleaving digital-to-analog converters (TI DAC) 402 includes a first sub-DAC 402A, a second sub-DAC 402B, and a M-th sub-DAC 402M and corresponds to the plurality of time-interleaving digital-to-analog converters (TI DAC) 102 (of FIG. 1). Therefore, signal processing apparatus 400 may also be referred as a M channel TI DAC architecture. The analog multiplexer 404, the digital compensation engine 412 and the voltage controller 416 corresponds to the analog multiplexer 104, the digital compensation engine 108, and the controller 112, respectively, of the signal processing apparatus 100 in FIG. 1.

The high frequency clock 406 is uniformly distributed to each sub-DAC of the plurality of TI DAC 402. Alternatively stated, the high frequency clock 406 is configured to generate the plurality of clocks 414 which controls the respective timing for each sub-DAC. The plurality of clocks 414 includes the clock signals for each sub-DAC. The plurality of clocks 414 includes a first clock 414A (i.e., $\alpha_1$) for the first sub-DAC 402A, and a M-th clock 414M (i.e., $\varphi_M$) for the M-th sub-DAC 402M.

The multiplexer clock 408 may include suitable logic, circuitry, interfaces and/or code that is configured to control the timing of the analog multiplexer (AMUX) 404.

The phase locked loop circuit (PLL) 410 may include suitable logic, circuitry, interfaces and/or code that is configured to adjust the frequency of the high frequency clock 406 and the multiplexer clock 408 by virtue of a change in phase, if any.

In the signal processing apparatus 400, the offset errors, the gain and the timing mismatches are compensated with precision. The offset errors can be compensated in the digital domain. A quantization noise (i.e., an encoding error) may result into a large offset error, for example, half of a least significant bit (LSB/2) of a DAC (e.g., the conventional TI (AMUX)-DAC), which can be compensated with more precision in the analog domain (e.g., the signal processing apparatus 400) instead of the digital domain. For the gain mismatches compensation in the digital domain an additional multiplier and an additional analog block to control the amplification of each sub-DAC are required. Similarly, for the timing mismatches compensation in the digital domain a fractional delay filter is required. Although, for the timing mismatches compensation in the analog domain, programmable delay blocks are required. In the digital domain, the compensation of the offset, gain and timing distortions is performed with a rough tuning, however, in the analog domain (e.g., 400), the compensation is performed with precision. The precision calibration in the analog domain (e.g., 400) does not incur additional performance penalty. In the mixed domain, the estimation and correction of time interlining (TI) errors such as gain and timing mismatches are performed with more accuracy such as in the signal processing apparatus 100 (of FIG. 1) and the signal processing apparatus 200 (of FIG. 2). The compensation of TI errors in the mixed domain provides a calibration procedure with reduced power consumption. Similarly, the signal processing apparatus 400 provides a precise calibration procedure without any performance degradation. In this way, the signal processing apparatus 100 (of FIG. 1) or the signal processing apparatus 200 (of FIG. 2) or the signal processing apparatus 400 (of FIG. 4) achieves the advantages of both analog as well as digital domain collectively and remove the aforementioned limitations.

Figure 5:
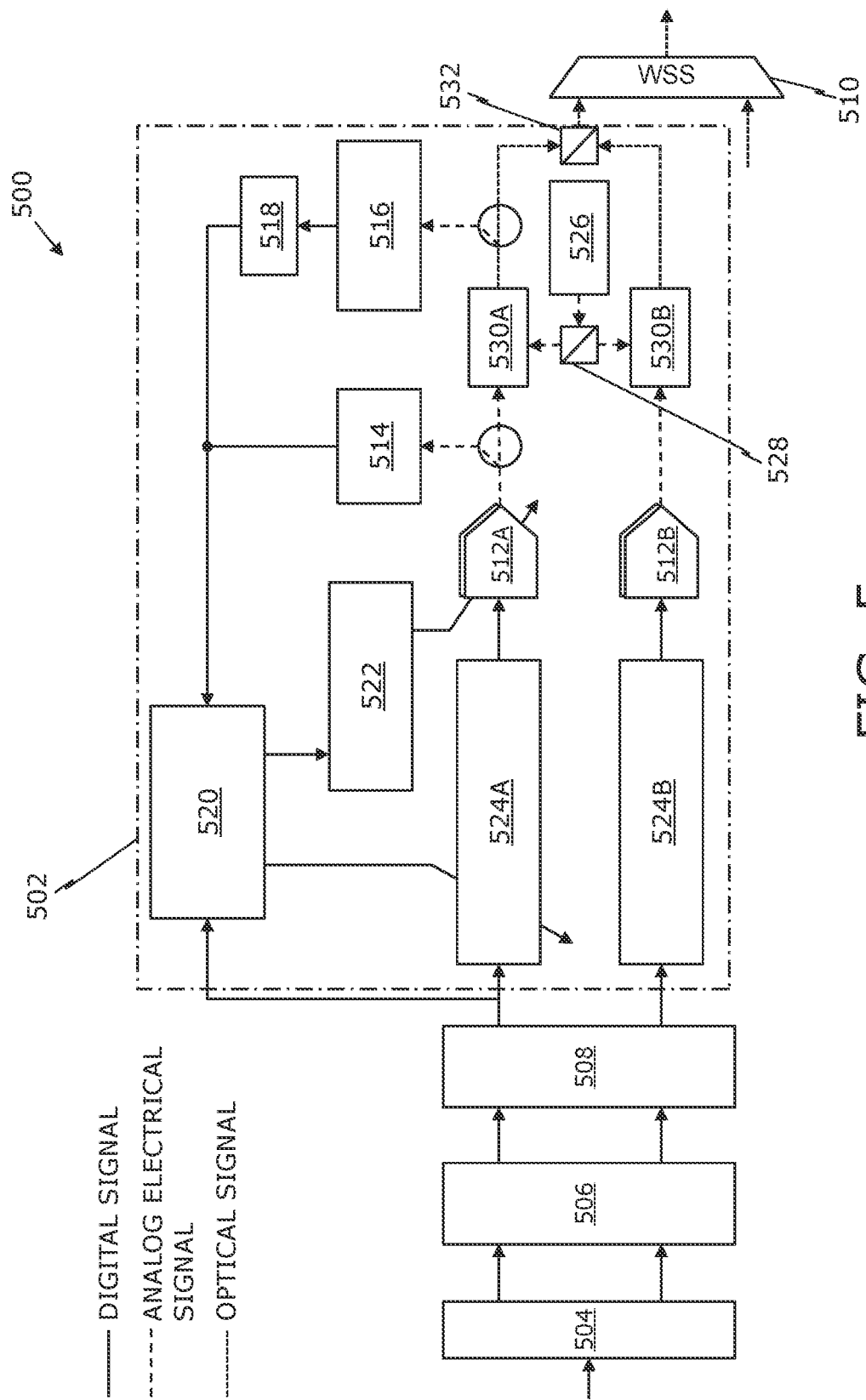
FIG. 5 is an illustration of an exemplary implementation of a digital-to-analog converter (DAC) time-interlining and non-linear error compensation as part of an optic transmission module, in accordance with an embodiment.

FIG. 5 is an illustration of an exemplary implementation of a digital-to-analog converter (DAC) time-interlining and non-linear error compensation as part of an optic transmission module, in accordance with an embodiment. FIG. 5 is described in conjunction with elements from FIGS. 1, 2, 3A, and 4. With reference to FIG. 5, there is shown a circuit architecture of an optic transmission module 500 that includes a digital-to-analog converter (DAC) with time-interlining and non-linear error compensation 502, a forward error control (FEC) encoder 504, a modulation and shaping circuit 506, a non-linear pre-compensation circuit 508 and a wavelength selective switch (WSS) 510. The DAC with time-interlining and non-linear error compensation 502 includes a first plurality of digital-to analog converters (DACs) 512A, a second plurality of DACs 512B, a local ADC 514, a power detector 516, an ADC 518, a DAC compensation engine 520, a DAC analog controller 522, a first DAC pre-compensation circuit 524A, a second DAC pre-compensation circuit 524B, a laser circuit 526, a polarization beam splitter (PBS) 528, a first circuit for intensity modulation 530A, a second circuit for intensity modulation 530B and a polarization beam combiner (PBC) 532. The solid lines used in the optic transmission module 500 represent digital signals and the two dotted lines represent analog signals and optical signals, respectively. However, the DAC with time-interlining and non-linear error compensation 502 may be represented by a dashed rectangular box, which is used for illustration only and do not form a part of the circuitry.

The optic transmission module 500 include suitable logic, circuitry, interfaces and/or code that is configured to provide a high capacity optical link by use of the DAC with time-interlining and non-linear error compensation 502. The DAC with time-interlining and non-linear error compensation 502 corresponds to the signal processing apparatus 100 (of FIG. 1) or the signal processing apparatus 200 (of FIG. 2). Thus, all the operations executed by the DAC with time-interlining and non-linear error compensation 502 are part of the operations executed by the optic transmission module 500. The optic transmission module 500 provides high resolution by virtue of increased effective number of bits (ENOB) and also, improved spectral efficiency, when potentially used in an ultra-wideband optical communication system or in a next generation optical communication system. The optic transmission module 500 may also be referred to as a transmitting device or a transmitter. Examples of the optic transmission module 500 includes, but is not limited to, a customized hardware for the ultra-wideband optical communication system, or any other portable or non-portable optical device.

The forward error control (FEC) encoder 504 include suitable logic, circuitry, interfaces and/or code that is configured to control errors (e.g., bit errors) in data transmission over a noisy communication channel.

The modulation and shaping circuit 506 include suitable logic, circuitry, interfaces and/or code that is configured to modulate an input signal (i.e., a low frequency signal) on to a high frequency signal.

The non-linear pre-compensation circuit 508 include suitable logic, circuitry, interfaces and/or code that is configured to compensate the non-linearities of the input signal.

The wavelength selective switch (WSS) 510 include suitable logic, circuitry, interfaces and/or code that is configured to dynamically route, block and attenuate different wavelengths used in an optical transmission technique (e.g., a dense wavelength division multiplexing (DWDM) technique).

Each of the first plurality of digital-to analog converters (DACs) 512A and the second plurality of DACs 512B corresponds to the plurality of time-interleaving digital-to-analog converters (TI DAC) 102 (of FIG. 1). Similarly, the local ADC 514, the power detector 516, the ADC 518, the DAC compensation engine 520 and the DAC analog controller 522 corresponds to the local ADC 106, the power detector 118, the ADC 120, the digital compensation engine 108 and the controller 112 of the signal processing apparatus 100 (of FIG. 1). Each of the first DAC pre-compensation circuit 524A and the second DAC pre-compensation circuit 524B corresponds to the digital pre-processing circuit 110 (of FIG. 1).

The laser circuit 526 may include suitable logic, circuitry, interfaces and/or code that is configured to generate a laser beam that is to be transmitted via the optic transmission module 500.

The polarization beam splitter (PBS) 528 may include suitable logic, circuitry, interfaces and/or code that is configured to split the generated laser beam into two polarized output laser beams with their polarization states orthogonal to each other.

Each of the first circuit for intensity modulation 530A and the second circuit for intensity modulation 530B (e.g., an intensity quadrature modulation (IQM) circuit) include suitable logic, circuitry, interfaces and/or code that is configured to modulate the two polarized output laser beams received from the polarization beam splitter (PBS) 528.

The polarization beam combiner (PBC) 532 may include suitable logic, circuitry, interfaces and/or code that is configured to combine the modulated laser beams from the first circuit for intensity modulation 530A and the second circuit for intensity modulation 530B, respectively, into a single output laser beam and further communicates it to the wavelength selective switch 510 for optical communication.

In operation, the time-interlining (TI) and non-linear errors associated with the first plurality of digital-to analog converters (DACs) 512A and the second plurality of DACs 512B are compensated by use of a local narrow feedback. The local narrow feedback is provided to the DAC calibration engine 520 through the local ADC 514, power detector 516 and the ADC 518. The DAC calibration engine 520 estimates the parameters in order to compensate the time interlining errors (e.g., gain and timing mismatches, offset errors) and non-linear distortions. The estimated parameters are communicated to the DAC analog controller 522 and the first DAC pre-compensation circuit 524A and the second DAC pre-compensation circuit 524B. The DAC analog controller 522 compensates the time interlining errors (e.g., gain and timing mismatches, offset errors) and non-linear distortions associated with each DAC of the first plurality of digital-to analog converters (DACs) 512A and the second plurality of DACs 512B. The first DAC pre-compensation circuit 524A and the second DAC pre-compensation circuit 524B compensate the time interlining errors (e.g., gain and timing mismatches, offset errors) and non-linear distortions of the input signal that is received from the non-linear pre-compensation circuit 508.

Thus, in the optic transmission module 500, the time interlining errors (e.g., gain and timing mismatches, offset errors) and non-linear distortions are compensated significantly. Hence, the optic transmission module 500 achieves high resolution by virtue of increased effective number of bits (ENOB) and also, an improved spectral efficiency that is suitable for use in the ultra-wideband optical communication system or in the next generation optical communication system.

Figure 6:
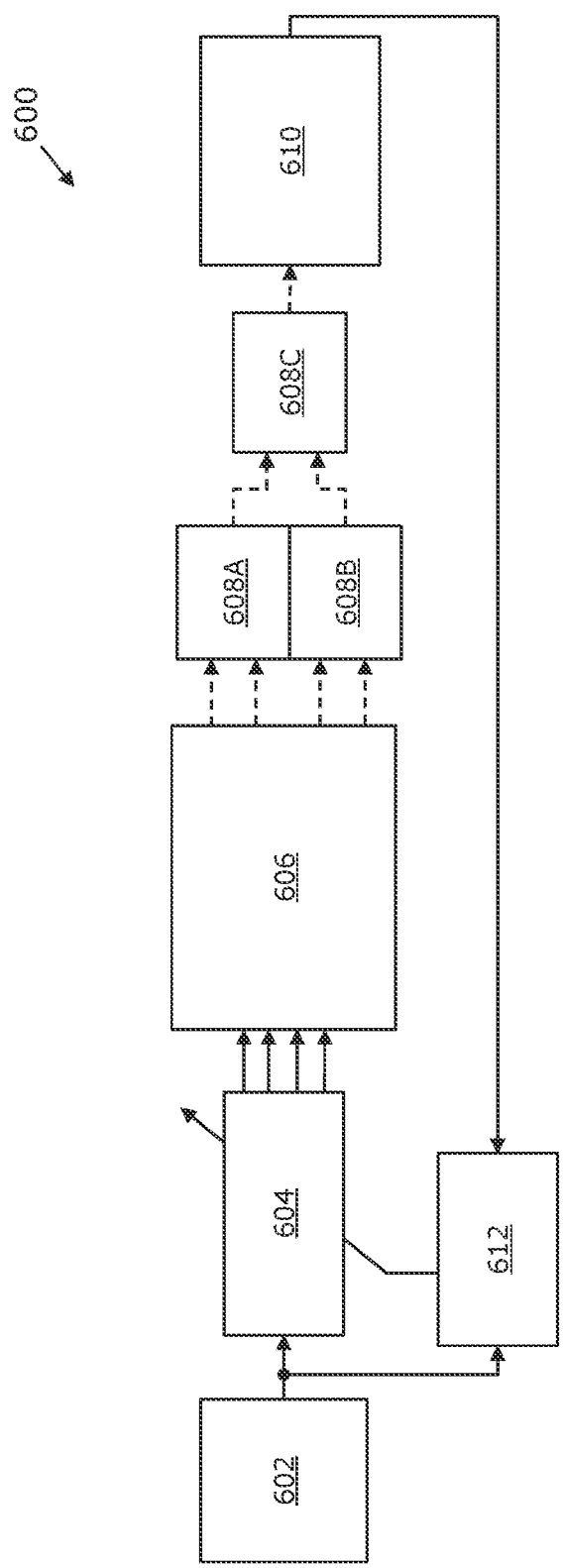
FIG. 6 a block diagram that illustrates various exemplary components of a time interleaved digital-to-analog converter (TI DAC) laboratory test bench, in accordance with an embodiment.

FIG. 6 a block diagram that illustrates various exemplary components of a time interleaved digital-to-analog converter (TI DAC) laboratory test bench, in accordance with an embodiment. FIG. 6 is described in conjunction with elements from FIGS. 1, 2, 3A, 4, and 5. With reference to FIG. 6, there is shown a block diagram of a time interleaved digital-to-analog converter (TI DAC) laboratory test bench 600 that includes a signal generator 602, a DAC digital pre-compensation circuit 604, a waveform generator 606, a first combiner 608A, a second combiner 608B, a third combiner 608C, an oscilloscope 610 and a DAC calibration engine 612.

The signal generator 602 include suitable logic, circuitry, interfaces and/or code that is configured to generate an input signal (e.g., a digital signal). The signal generator 602 may also function as a modulator and a multiplexer (MUX).

The DAC digital pre-compensation circuit 604 and the DAC calibration engine 612 corresponds to the digital pre-processing stage 110 and the digital compensation engine 108 of FIG. 1.

The waveform generator 606 include suitable logic, circuitry, interfaces and/or code that is configured to generate the signals on four channels (e.g., a first channel CH1, a second channel CH2, a third channel CH3 and a fourth channel CH4). The waveform generator 606 may corresponds to a Keysight arbitrary waveform generator M8195A and 65 GSa/s. The waveform generator 606 (i.e., the Keysight arbitrary waveform generator M8195A and 65 GSa/s) generate the signals of 25 GHz bandwidth and for an 8 bits TI-DAC on four channels.

The first combiner 608A include suitable logic, circuitry, interfaces and/or code that is configured to combine the signals from the first channel CH1 and the second channel CH2 of the waveform generator 606 and generate an output signal. Similarly, the second combiner 608B combines the signals from the third channel CH3 and the fourth channel CH4 of the waveform generator 606 and generate an output signal. The third combiner 608C combines the output signals from the first combiner 608A and the second combiner 608B, respectively and a generate a combined output signal.

The oscilloscope 610 include suitable logic, circuitry, interfaces and/or code that is configured to display the combined output signal from the third combiner 608C. The oscilloscope 610 may correspond to a Keysight Infiniium oscilloscope DSOZ254A. The oscilloscope 610 (i.e. the Keysight Infiniium oscilloscope DSOZ254A) is used to display the signals of 8 bits and of 50 GHz bandwidth and with low pass filter. The transmitter and receiver side of the oscilloscope 610 is synchronized by a reference clock. The gain and timing mismatches and offset errors are adjusted inside the oscilloscope 610. The experimental results of the TI DAC laboratory test bench 600 are described in detail, for example, in FIGS. 8A and 8B.

Figure 7A:
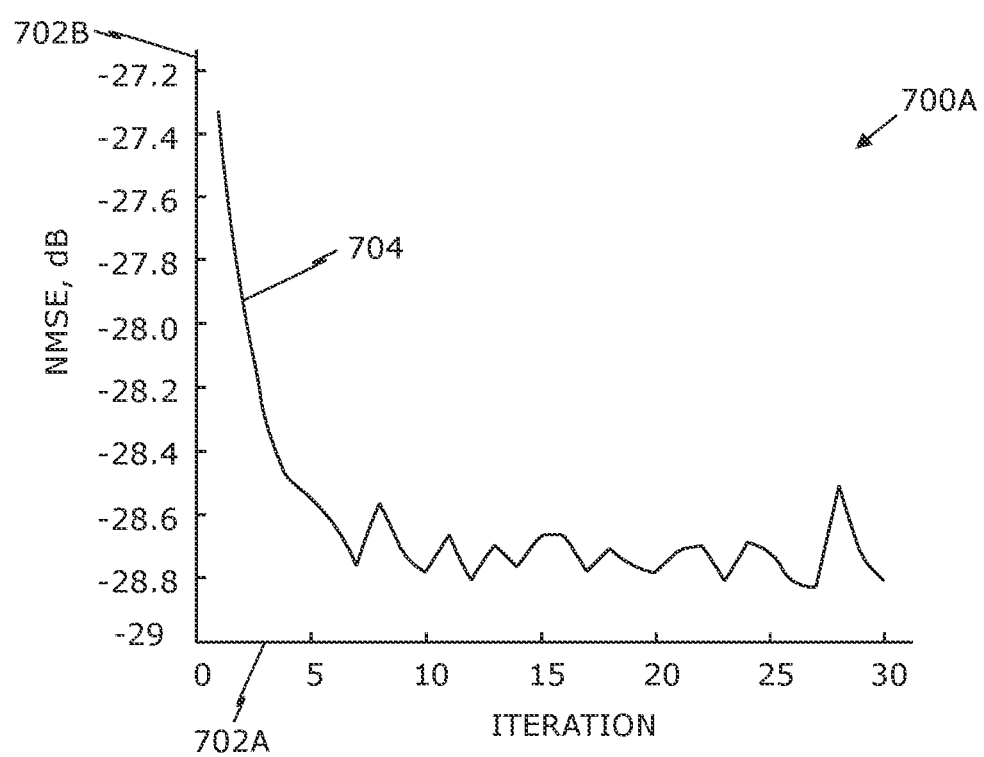
FIG. 7A is a graphical representation that illustrates normalized mean square error (NMSE) convergence of a TI DAC that corresponds to a signal processing apparatus, in accordance with an embodiment.

FIG. 7A is a graphical representation that illustrates normalized mean square error (NMSE) convergence of a TI DAC that corresponds to a signal processing apparatus, in accordance with an embodiment. FIG. 7A is described in conjunction with elements from FIGS. 1, 2, 3A, 3B, and 4. With reference to FIG. 7A, there is shown a graphical representation 700A that illustrates normalized mean square error (NMSE) convergence of a TI DAC. The TI DAC may also be referred as a TI (AMUX)-DAC. The TI DAC corresponds to the signal processing apparatus 100 (of FIG. 1) or the signal processing apparatus 200 (of FIG. 2). The graphical representation 700A includes an X-axis 702A that represents number of iterations and a Y-axis 702B that represents normalized mean square error (NMSE) in dB.

In the graphical representation 700A, a solid line 704 represents normalized mean square error (NMSE) of the TI DAC in a decreasing order. The solid line 704 of normalized mean square error (NMSE) convergence of the TI DAC is obtained through simulation. The normalized mean square error (NMSE) of the TI DAC decreases with increase in the number of iterations. This indicates that the TI DAC which corresponds to the signal processing apparatus 100 (of FIG. 1) or the signal processing apparatus 200 (of FIG. 2) has less errors (e.g., mean square errors) after calibration. The reason is that in the TI DAC (e.g., the signal processing apparatus 100 or 200), the time interlining (TI) and non-linear distortions are compensated to a significant extent which results in less errors (i.e., mean square errors).

Figure 7B:
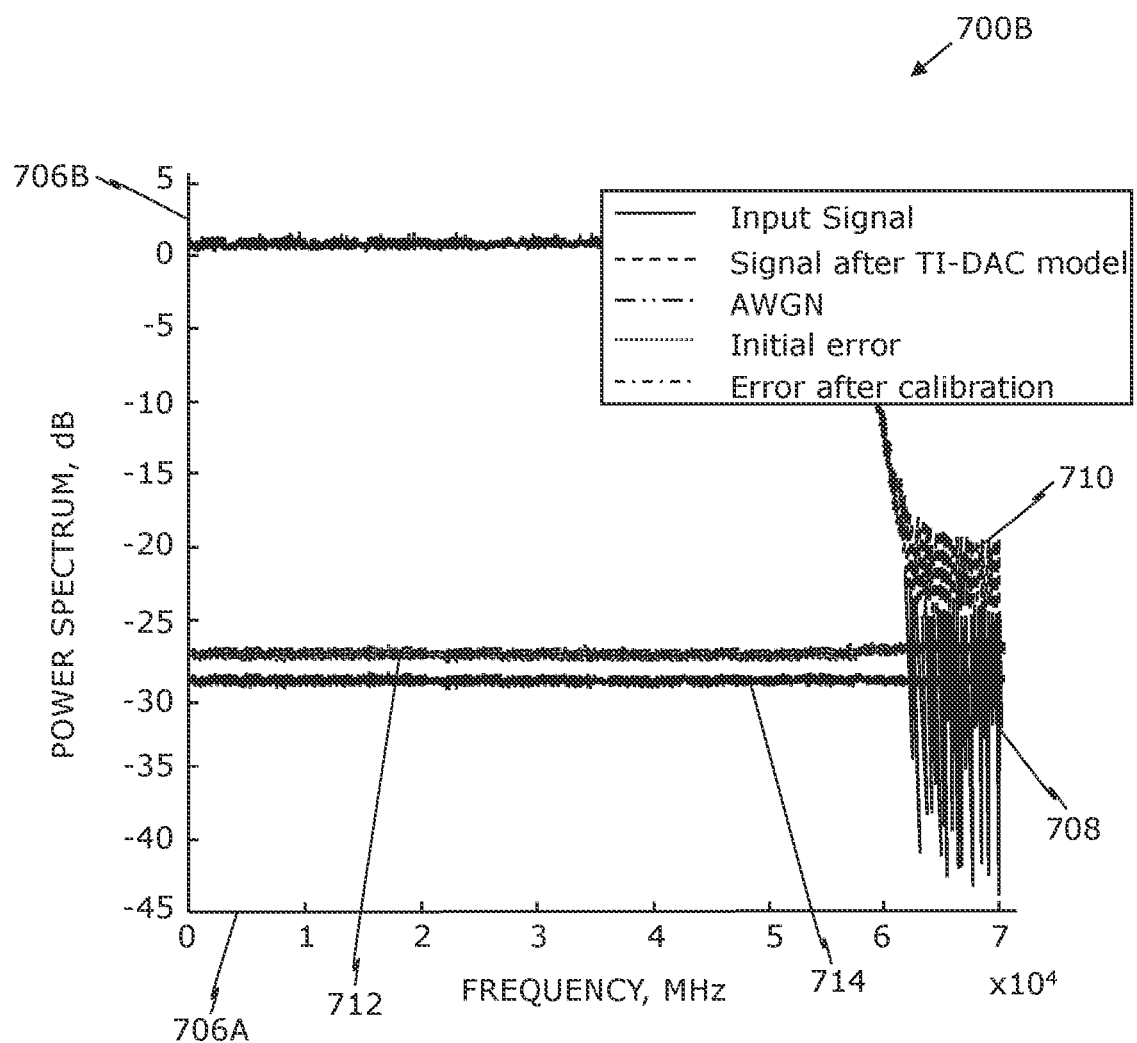
FIG. 7B is a graphical representation that illustrates signal spectrum of a TI DAC that corresponds to a signal processing apparatus, in accordance with an embodiment.

FIG. 7B is a graphical representation that illustrates signal spectrum of a TI DAC that corresponds to a signal processing apparatus, in accordance with an embodiment. FIG. 7B is described in conjunction with elements from FIGS. 1, 2, 3A, 3B, 4, and 7A. With reference to FIG. 7B, there is shown a graphical representation 700B that illustrates signal spectrum of a TI DAC. The TI DAC may also be referred as a TI (AMUX)-DAC. The TI DAC corresponds to the signal processing apparatus 100 (of FIG. 1) or the signal processing apparatus 200 (of FIG. 2). The graphical representation 700B includes an X-axis 706A that represents frequency in MHz and a Y-axis 706B that represents signal spectrum in dB. The signal spectrum may also be referred as a power spectrum.

In the graphical representation 700B, a first signal 708 represents an input signal to the TI DAC. A second signal 710 represents an output signal from the TI DAC. A third signal 712 represents an initial error of the TI DAC before distortion parameters compensation. A fourth signal 714 represents an error of the TI DAC after distortion parameters compensation. This indicates that after compensation of distortion parameters, the error (represented by 714) of the TI DAC is less in comparison to the error (represented by 712) before compensation of distortion parameters.

Figure 7C:
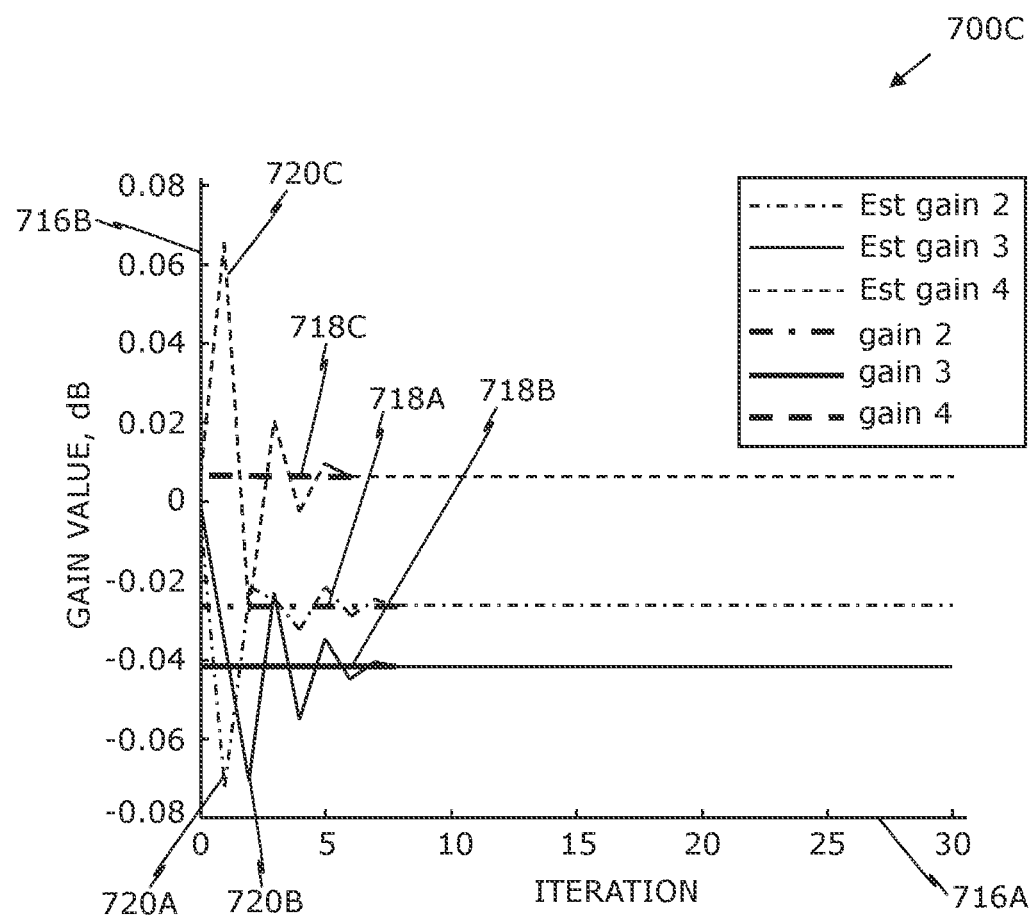
FIG. 7C is a graphical representation that illustrates gain mismatches parameters estimation of a TI DAC that corresponds to a signal processing apparatus, in accordance with an embodiment.

FIG. 7C is a graphical representation that illustrates gain mismatches parameters estimation of a TI DAC that corresponds to a signal processing apparatus, in accordance with an embodiment. FIG. 7C is described in conjunction with elements from FIGS. 1, 2, 3A, 3B, 4, 7A, and 7B. With reference to FIG. 7C, there is shown a graphical representation 700C that illustrates gain convergence control of a TI DAC. The TI DAC may also be referred as a TI (AMUX)-DAC. The TI DAC corresponds to the signal processing apparatus 100 (of FIG. 1) or the signal processing apparatus 200 (of FIG. 2). The graphical representation 700C includes an X-axis 716A that represents number of iterations and a Y-axis 716B that represents gain values in dB which are estimated for compensation of the gain mismatches of the TI DAC.

In the graphical representation 700C, a first line 718A, a second line 718B and a third line 718C represent the gain values in dB before compensation of gain distortion parameters in the TI DAC. Similarly, in the graphical representation 700C, a fourth line 720A, a fifth line 720B and a sixth line 720C represent the estimated gain values in dB after calibration of the TI DAC. The gain values in the fourth line 720A, the fifth line 720B and the sixth line 720C may also be referred as the estimated gain parameters which are used to compensate the gain mismatches in the TI DAC (e.g., in the signal processing apparatus 100 or 200).

Figure 7D:
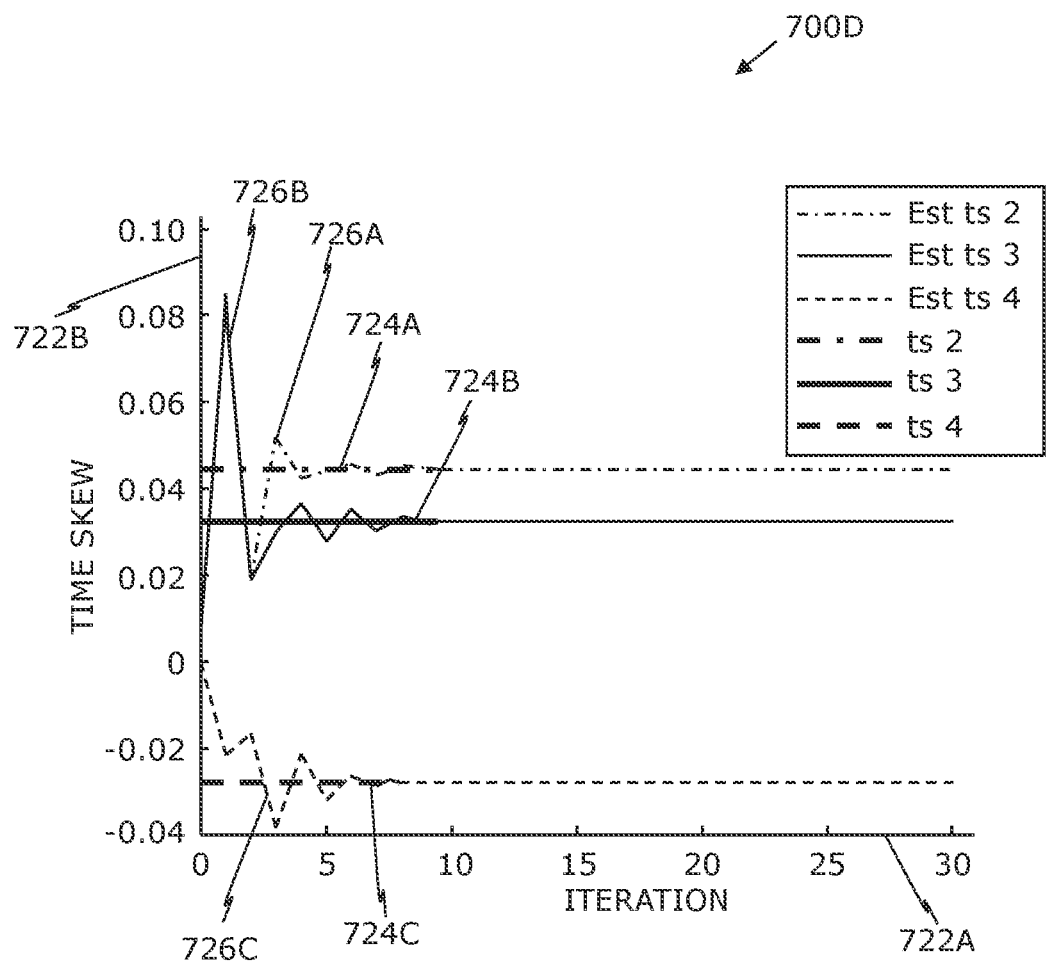
FIG. 7D is a graphical representation that illustrates timing mismatches parameters estimation of a TI DAC that corresponds to a signal processing apparatus, in accordance with an embodiment.

FIG. 7D is a graphical representation that illustrates timing mismatches parameters estimation of a TI DAC that corresponds to a signal processing apparatus, in accordance with an embodiment. FIG. 7D is described in conjunction with elements from FIGS. 1, 2, 3A, 3B, 4, 7A, 7B, and 7C. With reference to FIG. 7D, there is shown a graphical representation 700D that illustrates timing mismatches convergence control of a TI DAC. The TI DAC may also be referred as a TI (AMUX)-DAC. The TI DAC corresponds to the signal processing apparatus 100 (of FIG. 1) or the signal processing apparatus 200 (of FIG. 2). The graphical representation 700D includes an X-axis 722A that represents number of iterations and a Y-axis 722B that represents timing values which are estimated for compensation of the timing mismatches of the TI DAC. The timing mismatches may also be referred as the timing skew (TS) or clock skew.

In the graphical representation 700D, a first line 724A, a second line 724B and a third line 724C represent the time values before compensation of timing mismatches. Similarly, in the graphical representation 700D, a fourth line 726A, a fifth line 726B and a sixth line 726C represent the estimated time values after calibration of the TI DAC. The time values in the fourth line 726A, the fifth line 726B and the sixth line 726C may also be referred as the estimated timing parameters which are used to compensate the timing mismatches in the TI DAC (e.g., in the signal processing apparatus 100 or 200).

Figure 8A:
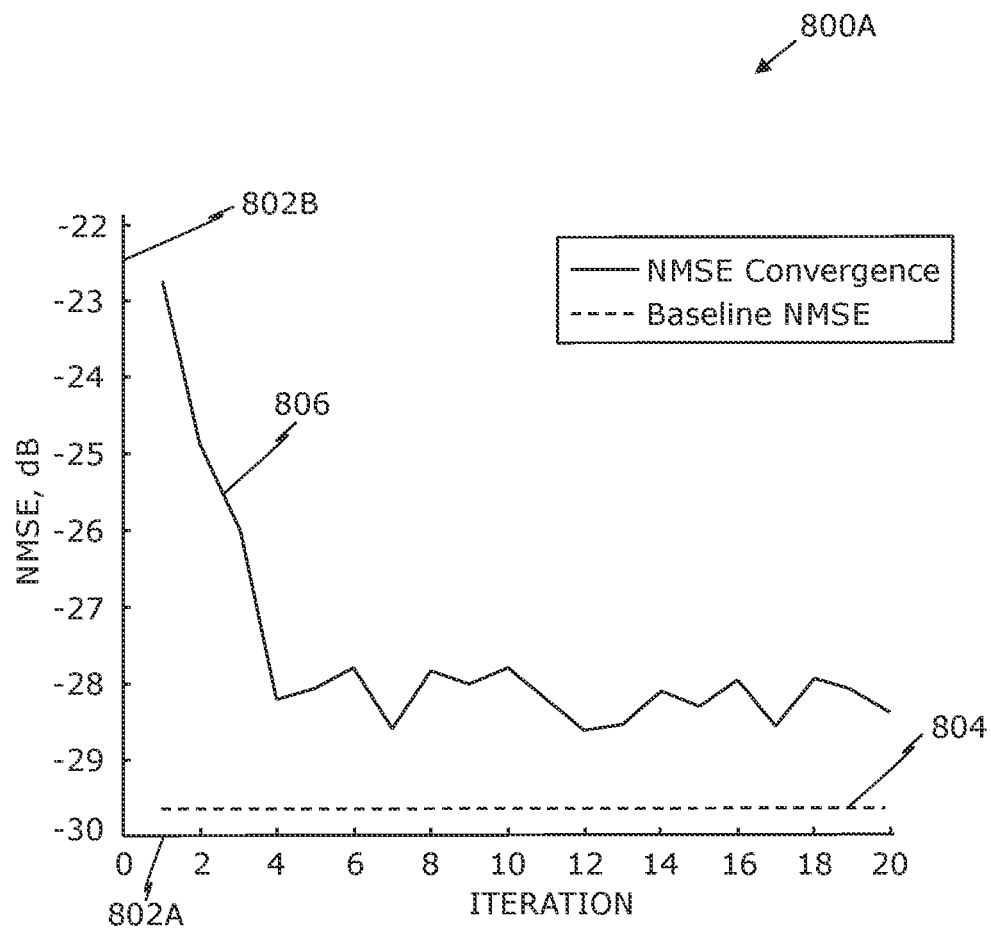
FIG. 8A is a graphical representation that illustrates normalized mean square error (NMSE) convergence of a TI DAC laboratory test bench, in accordance with an embodiment.

FIG. 8A is a graphical representation that illustrates normalized mean square error (NMSE) convergence of a TI DAC laboratory test bench, in accordance with an embodiment. FIG. 8A is described in conjunction with elements from FIGS. 1, 2, 3A, 3B, 4, 6, and 7A. With reference to FIG. 8A, there is shown a graphical representation 800A that illustrates normalized mean square error (NMSE) convergence of a TI DAC laboratory test bench (e.g., the TI DAC laboratory test bench 600 of FIG. 6). The graphical representation 800A includes an X-axis 802A that represents number of iterations and a Y-axis 802B that represents normalized mean square error (NMSE) in dB.

In the graphical representation 800A, a dotted line 804 represents baseline error in dB of the TI DAC laboratory test bench (e.g., the TI DAC laboratory test bench 600). A solid line 806 represents normalized mean square error (NMSE) convergence of the TI DAC laboratory test bench (e.g., the TI DAC laboratory test bench 600). The solid line 806 of normalized mean square error (NMSE) convergence is obtained through an experiment performed on the TI DAC laboratory test bench (e.g., the TI DAC laboratory test bench 600). The normalized mean square error (NMSE) of the TI DAC laboratory test bench (e.g., the TI DAC laboratory test bench 600) decreases with increase in the number of iterations and is found in alignment with the simulation results that has been described in detail, for example, in FIG. 7A.

Figure 8B:
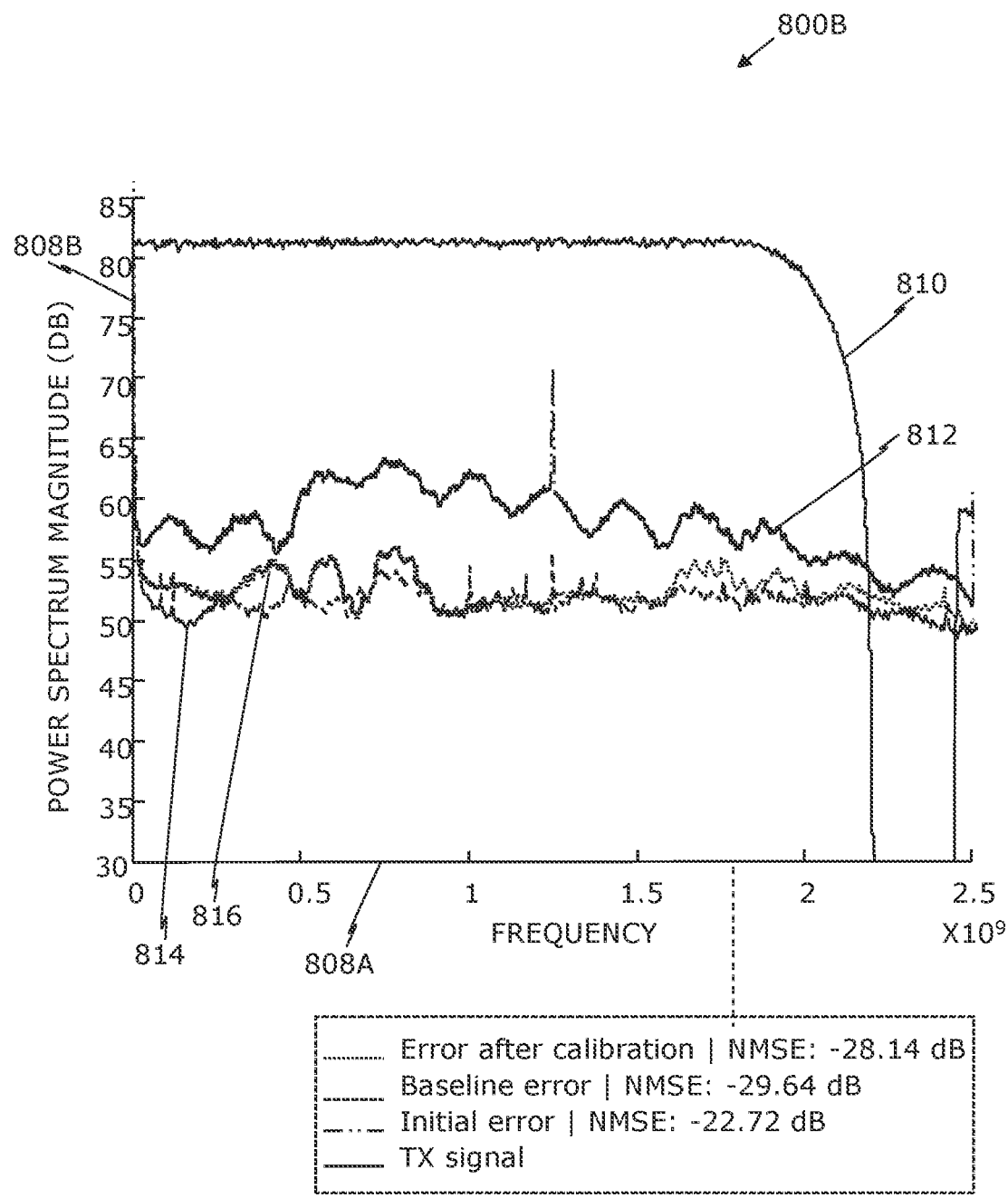
FIG. 8B is a graphical representation that illustrates signal spectrum of a TI DAC laboratory test bench, in accordance with an embodiment.

FIG. 8B is a graphical representation that illustrates signal spectrum of a TI DAC laboratory test bench, in accordance with an embodiment. FIG. 8B is described in conjunction with elements from FIGS. 1, 2, 3A, 3B, 4, 6, and 7B. With reference to FIG. 8B, there is shown a graphical representation 800B that illustrates signal spectrum of a TI DAC laboratory test bench (e.g., the TI DAC laboratory test bench 600). The graphical representation 800B includes an X-axis 808A that represents frequency in MHz and a Y-axis 808B that represents signal spectrum in dB. The signal spectrum may also be referred as a power spectrum.

In the graphical representation 800B, a first signal 810 represents an input signal to the TI DAC laboratory test bench. The input signal may also be referred as a transmitted signal to the TI DAC laboratory test bench (e.g., the TI DAC laboratory test bench 600). A second signal 812 represents an initial error (e.g., normalized mean square error (NMSE): −22.72 dB) of the TI DAC laboratory test bench (e.g., the TI DAC laboratory test bench 600) before distortion parameters compensation. A third signal 814 represents a baseline error (e.g., NMSE: −29.64 dB) of the TI DAC laboratory test bench (e.g., the TI DAC laboratory test bench 600). A fourth signal 816 represents an error (e.g., NMSE: −28.14 dB) after calibration of the TI DAC laboratory test bench (e.g., the TI DAC laboratory test bench 600). This indicates that after compensation of distortion parameters, the error (represented by 816) of the TI DAC laboratory test bench (e.g., the TI DAC laboratory test bench 600) is less in comparison to the initial error (represented by 812) before compensation of distortion parameters.

Figure 9:
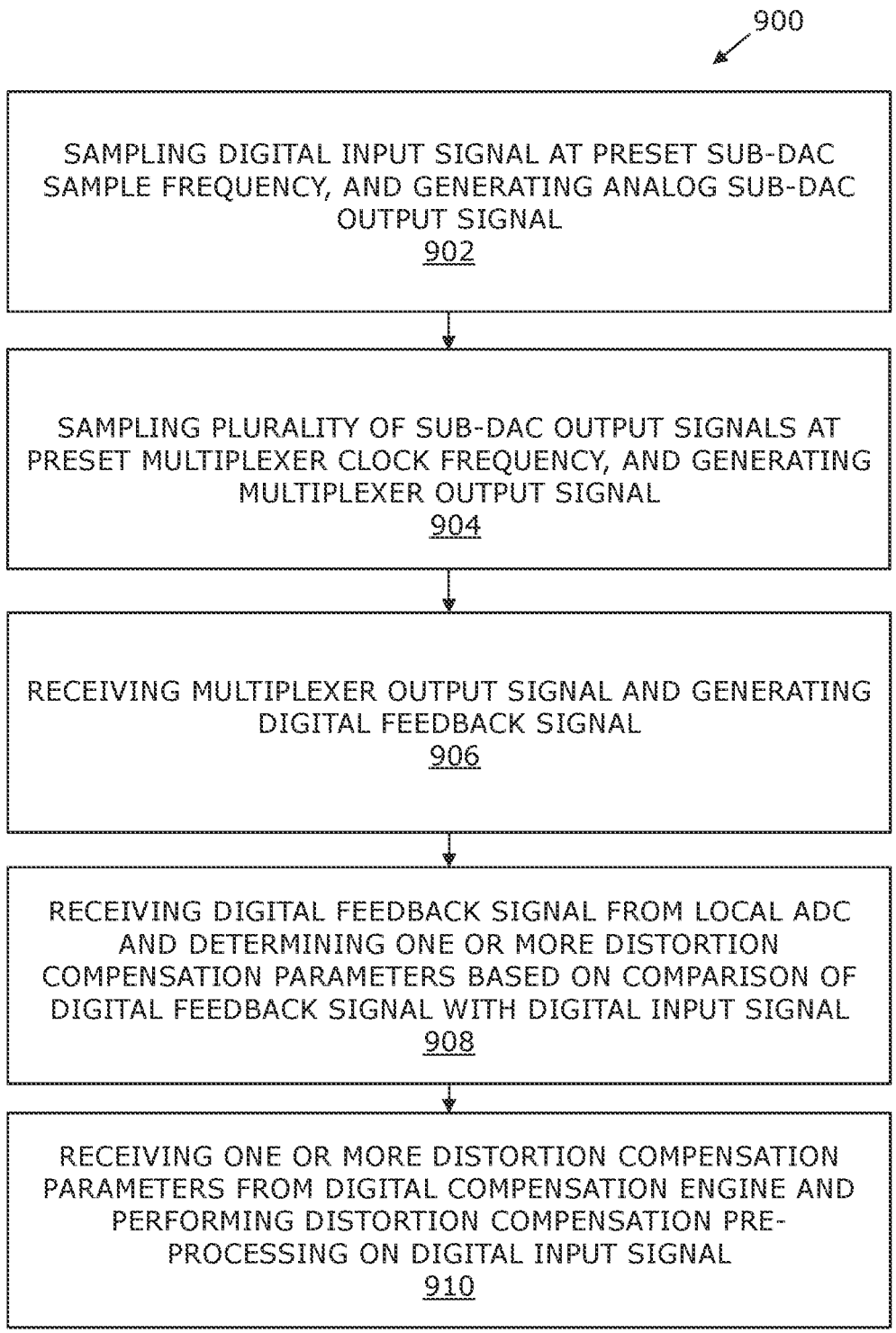
FIG. 9 is a flowchart of a method for time interlining linear and non-linear distortion compensation of a TI DAC, in accordance with an embodiment.

FIG. 9 is a flowchart of a method for time interlining linear and non-linear distortion compensation of a time interleaved digital-to-analog converter (TI DAC), in accordance with an embodiment. The method 900 is executed, for example, by the signal processing apparatus 100. The method 900 includes steps 902 to 910.

At step 902, the method 900 includes sampling a digital input signal at a preset sub-DAC sample frequency and generating an analog sub-DAC output signal. Each of the plurality of time-interleaving digital-to-analog converters (e.g., sub-DACs 102) is configured to sample the digital input signal at the preset sub-DAC sample frequency, and to generate the analog sub-DAC output signal.

At step 904, the method 900 further includes sampling the plurality of sub-DAC output signals at a preset multiplexer clock frequency and generating a multiplexer 104 output signal. The analog multiplexer 104 is configured to sample the plurality of sub-DAC (e.g., sub-DACs 102) output signals at the preset multiplexer clock frequency, and to generate the multiplexer 104 output signal.

At step 906, the method 900 further includes receiving the multiplexer 104 output signal and generating a digital feedback signal. The local analog-to-digital converter, local ADC 106, is configured to receive the multiplexer 104 output signal and to generate the digital feedback signal.

At step 908, the method 900 further includes receiving the digital feedback signal from the local ADC 106 and determining one or more distortion compensation parameters based on a comparison of the digital feedback signal with the digital input signal. The digital compensation engine 108 is configured to receive the digital feedback signal from the local ADC 106 and to determine the one or more distortion compensation parameters based on the comparison of the digital feedback signal with the digital input signal.

At step 910, the method 900 further includes receiving the one or more distortion compensation parameters from the digital compensation engine 108 and performing distortion compensation pre-processing on the digital input signal. The digital pre-processing stage 110 is configured to receive the one or more distortion compensation parameters from the digital compensation engine 108 and to perform distortion compensation pre-processing on the digital input signal.

In accordance with an embodiment, the method 900 further includes generating a single frequency sample tone to the digital pre-processing stage 110. The single tone generator 114 is configured to output the single frequency sample tone to the digital pre-processing stage 110.

In accordance with an embodiment, the method 900 further includes receiving the multiplexer 104 output signal and generating a power feedback signal. The power detector 118 is configured to receive the multiplexer 104 output signal and to generate the power feedback signal.

In accordance with an embodiment, the method 900 further includes receiving the power feedback signal from the power detector 118 and determining one or more sub-DAC voltage offset parameters based on a comparison of the power feedback signal with the single frequency sample tone. The digital compensation engine 108 is configured to receive the power feedback signal from the power detector 118 and to determine one or more of the sub-DAC voltage offset parameters based on the comparison of the power feedback signal with the single frequency sample tone.

In accordance with an embodiment, the method 900 further includes providing the single frequency sample tone to the digital pre-processing stage 110 while the digital input signal is not input to the digital pre-processing stage. The single tone generator 114 is configured to output the single frequency sample tone while the digital input signal is not input to the digital pre-processing stage 110.

In accordance with an embodiment, the method 900 further includes receiving one or more sub-DAC gain parameters and/or sub-DAC voltage offset parameters and adjusting a respective gain and/or voltage offset for each sub-DAC. The sub-DAC voltage controller (e.g., the controller 112) is configured to receive the one or more sub-DAC gain parameters and/or sub-DAC voltage offset parameters, and to adjust the respective gain and/or voltage offset for each sub-DAC.

In accordance with an embodiment, the method 900 further includes sampling the multiplexer 104 output signal at a preset sampling frequency which is substantially smaller than the multiplexer 104 clock frequency. The local ADC 106 is configured to sample the multiplexer output signal at the preset sampling frequency which is substantially smaller than the multiplexer 104 clock frequency.

In accordance with an embodiment, the method 900 further includes generating a noise in an out-of-band region of the digital input signal. The pseudorandom noise generator 122 is configured to generate the noise in the out-of-band region of the digital input signal. The steps 902 to 910 are only illustrative and other alternatives can also be provided where one or more steps are added, one or more steps are removed, or one or more steps are provided in a different sequence without departing from the scope of the embodiments.

Modifications to embodiments described in the foregoing are possible without departing from the scope of embodiments. Expressions such as "including", "comprising", "incorporating", "have", "is" used to describe the embodiments are intended to be construed in a non-exclusive manner, namely allowing for items, components or elements not explicitly described also to be present. Reference to the singular is also to be construed to relate to the plural. The word "exemplary" is used herein to mean "serving as an example, instance or illustration". Any embodiment described as "exemplary" is not necessarily to be construed as preferred or advantageous over other embodiments and/or to exclude the incorporation of features from other embodiments. The word "optionally" is used herein to mean "is provided in some embodiments and not provided in other embodiments". It is appreciated that certain features of the embodiments, which are, for clarity, described in the context of separate embodiments, may also be provided in combination in a single embodiment. Conversely, various features of the embodiments, which are, for brevity, described in the context of a single embodiment, may also be provided separately or in any suitable combination or as suitable in any other described embodiment.

The invention claimed is:

1. A signal processing apparatus, comprising:
a plurality of time-interleaving digital-to-analog converters (sub-DACs), each configured to sample a digital input signal at a preset sub-DAC sample frequency, and to generate an analog sub-DAC output signal;
an analog multiplexer configured to sample the plurality of sub-DAC output signals at a preset multiplexer clock frequency, and to generate a multiplexer output signal;
a local analog-to-digital converter (ADC), configured to receive the multiplexer output signal and generate a digital feedback signal;
a digital compensation engine configured to receive the digital feedback signal from the local ADC and determine one or more distortion compensation parameters based on a comparison of the digital feedback signal with the digital input signal; and
a digital pre-processing stage configured to receive the one or more distortion compensation parameters from the digital compensation engine and perform distortion compensation pre-processing on the digital input signal.

2. The signal processing apparatus of claim 1, wherein the digital pre-processing stage is configured to perform the distortion compensation pre-processing online.

3. The signal processing apparatus of claim 1, wherein the distortion compensation parameters include one or more sub-DAC sample frequency parameters.

4. The signal processing apparatus of claim 3, further comprising a sub-DAC time-delay controller, configured to receive the one or more sub-DAC sample frequency parameters, and to adjust a respective time-delay for each sub-DAC.

5. The signal processing apparatus of claim 1, wherein the distortion compensation parameters include one or more sub-DAC non-linearity parameters, and the digital compensation engine is configured to determine the sub-DAC non-linearity parameters based on parameters of a memoryless spline digital pre-distorter model.

6. The signal processing apparatus of claim 4, wherein the distortion compensation parameters include one or more sub-DAC gain parameters.

7. The signal processing apparatus of claim 6, wherein the distortion compensation parameters include one or more sub-DAC voltage offset parameters.

8. The signal processing apparatus of claim 7, further comprising:
   a single tone generator configured to output a single frequency sample tone to the digital pre-processing stage; and
   a power detector configured to receive the multiplexer output signal and generate a power feedback signal;
   wherein the digital compensation engine is configured to receive the power feedback signal from the power detector and determine one or more of the sub-DAC voltage offset parameters based on a comparison of the power feedback signal with the single frequency sample tone.

9. The signal processing apparatus of claim 8, wherein the single tone generator is configured to output the single frequency sample tone while the digital input signal is not input to the digital pre-processing stage.

10. The signal processing apparatus of claim 9, further comprising
    a sub-DAC voltage controller, configured to receive the one or more sub-DAC gain parameters and/or sub-DAC voltage offset parameters, and to adjust a respective gain and/or voltage offset for each sub-DAC.

11. The signal processing apparatus of claim 1, wherein the local ADC is configured to sample the multiplexer output signal at a preset sampling frequency which is substantially smaller than the multiplexer clock frequency.

12. The signal processing apparatus of claim 1, further comprising:
    a pseudorandom noise generator configured to generate noise in an out-of-band region of the digital input signal.

* * * * *